United States Patent
Kadoya

(10) Patent No.: US 9,209,192 B2
(45) Date of Patent: Dec. 8, 2015

(54) SEMICONDUCTOR DEVICE AND METHOD OF FABRICATING THE SAME

(75) Inventor: Tomohiro Kadoya, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 807 days.

(21) Appl. No.: 12/982,342

(22) Filed: Dec. 30, 2010

(65) Prior Publication Data

US 2011/0169062 A1    Jul. 14, 2011

(30) Foreign Application Priority Data

Jan. 8, 2010   (JP) .................. 2010-002863

(51) Int. Cl.
*H01L 27/108* (2006.01)
*H01L 21/768* (2006.01)
*H01L 49/02* (2006.01)
*H01L 21/8234* (2006.01)
*H01L 27/02* (2006.01)

(52) U.S. Cl.
CPC .... *H01L 27/10894* (2013.01); *H01L 21/76895* (2013.01); *H01L 27/10855* (2013.01); *H01L 27/10888* (2013.01); *H01L 28/91* (2013.01); *H01L 21/823475* (2013.01); *H01L 27/0207* (2013.01); *H01L 27/10852* (2013.01)

(58) Field of Classification Search
USPC ............. 257/296, 368, 758, E27.06, E27.084
See application file for complete search history.

(56) References Cited

U.S. PATENT DOCUMENTS

| | | | |
|---|---|---|---|
| 6,207,986 B1* | 3/2001 | Yamanaka et al. | 257/296 |
| 6,265,778 B1* | 7/2001 | Tottori | 257/758 |
| 2008/0239815 A1* | 10/2008 | Nakamura et al. | 365/185.13 |

FOREIGN PATENT DOCUMENTS

| | | |
|---|---|---|
| JP | 11-214660 | 8/1999 |
| JP | 2002-319632 | 10/2002 |
| JP | 2005-260254 | 9/2005 |

* cited by examiner

*Primary Examiner* — Minh-Loan Tran
*Assistant Examiner* — Leslie Pilar Cruz

(57) ABSTRACT

A semiconductor device includes the following elements. An element isolation portion separates first and second diffusion regions in a semiconductor substrate each other. A first insulating film is formed over the element isolation portion and the first and second diffusion regions. First and second contact plugs are formed over the first and second diffusion regions, respectively. The first and second contact plugs penetrate the first insulating film. A first conductive layer is formed over the first insulating film over the element isolation portion. A second insulating film is formed over the first conductive layer. A third contact plug penetrates the second insulating film, the third contact plug connecting the first contact plug. A second conductive layer is formed over the second insulating film contacting the third contact plug. The first and second conductive layers partly overlap the element isolation portion.

15 Claims, 16 Drawing Sheets

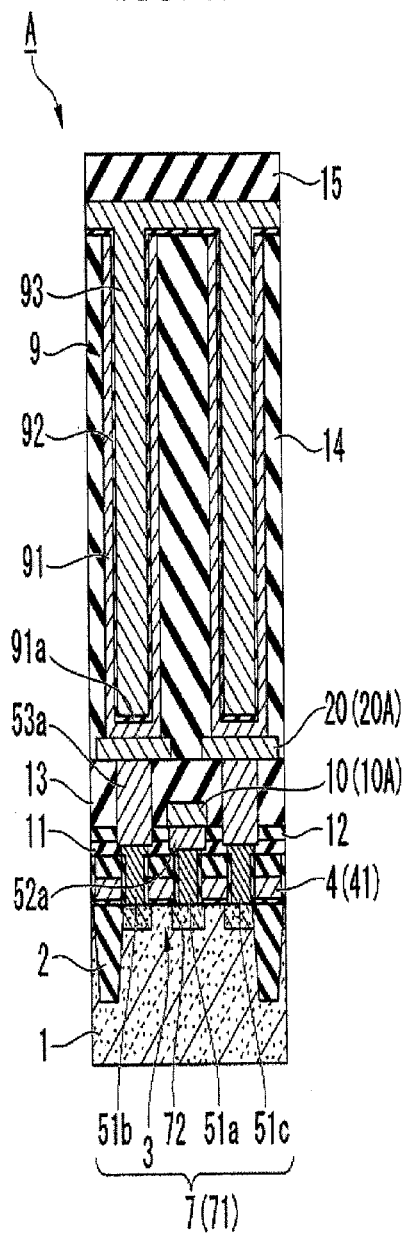
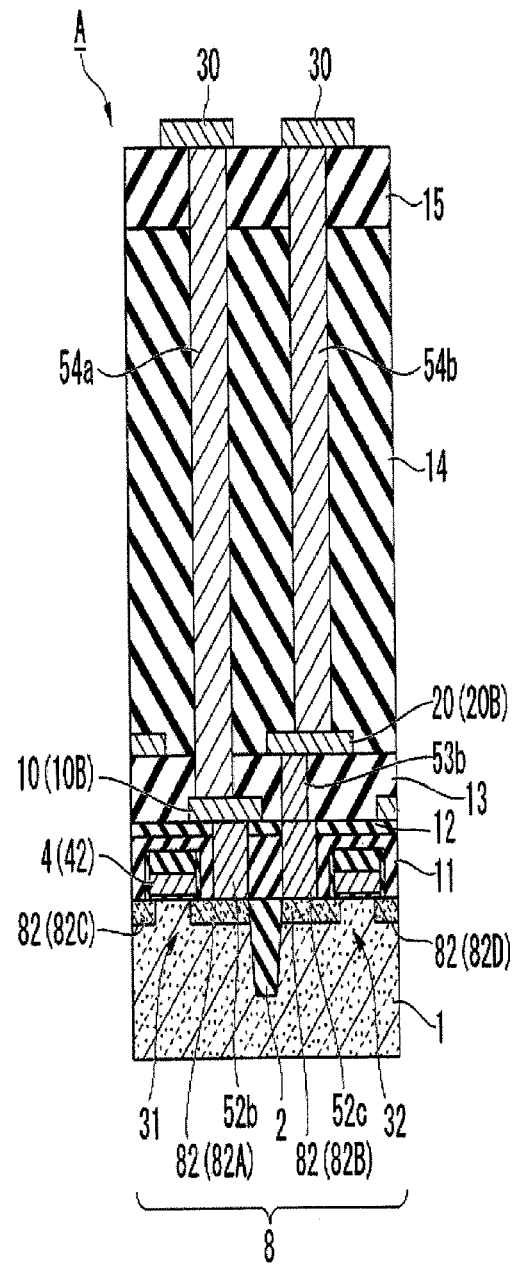

FIG. 9A
FIG. 9B
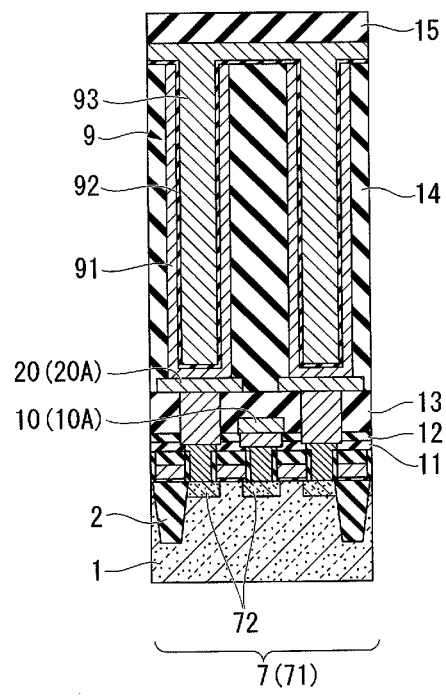
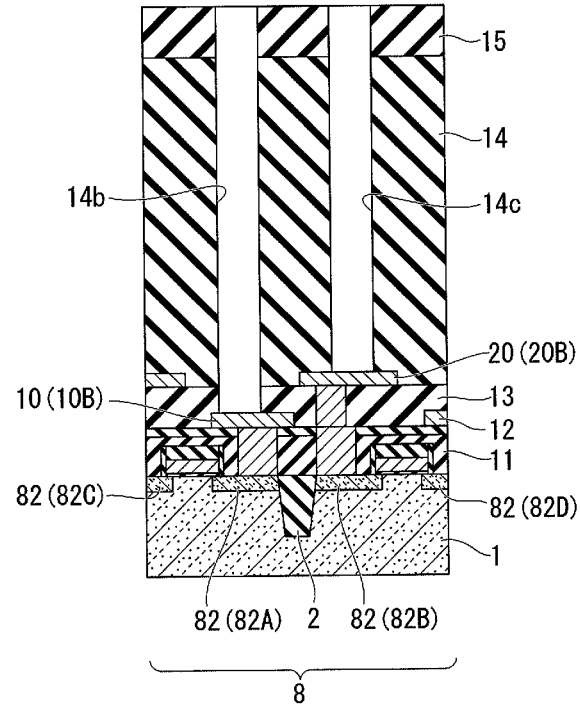

SEMICONDUCTOR DEVICE AND METHOD OF FABRICATING THE SAME

BACKGROUND OF THE INVENTION

1. Field of the Invention

The present invention relates to a semiconductor device and a method of fabricating the same.

Priority is claimed on Japanese Patent Application No. 2010-002863, Jan. 8, 2010, the content of which is incorporated herein by reference.

2. Description of the Related Art

In general, a dynamic random access memory (DRAM) device largely has a memory cell region configured to store and retain data and a peripheral circuit region configured to input and output data between the memory cell region and the outside of a device. Also, a sense amplifier circuit and a word line driver circuit are disposed in a region (or a connection portion) of the peripheral circuit region, which is disposed adjacent to the memory cell region. Here, with miniaturization of the memory cell region, it is necessary to reduce the area occupied by the sense amplifier circuit and the word line driver circuit.

Furthermore, in the field of semiconductor devices, such as DRAMs, an increase in the functionality of equipment using the semiconductor devices leads to new progress of highly integrated devices. With the development of miniaturization of semiconductor devices corresponding to an increase in the integration density of DRAMs, a method of increasing the height of an electrode of a capacitor by forming the electrode of the capacitor in a 3-dimensional shape, such as a cylindrical shape. This structure which increases the surface area of the electrode has typically been adopted in order to ensure the capacitance required for the capacitor constituting a memory cell region.

SUMMARY

In one embodiment, a semiconductor device may include, but is not limited to, the following elements. First and second diffusion regions are formed in a semiconductor substrate. An element isolation portion separates the first and second diffusion regions each other. A first insulating film is formed over the element isolation portion and the first and second diffusion regions. First and second contact plugs are formed over the first and second diffusion regions, respectively. The first and second contact plugs penetrate the first insulating film. A first conductive layer is formed over the first insulating film. A second insulating film is formed over the first conductive layer. A third contact plug penetrates the second insulating film. The third contact plug is connected to the first contact plug. A second conductive layer is formed over the second insulating film. The second conductive layer contacts the third contact plug. The first and second conductive layers partly overlap the element isolation portion.

In another embodiment, a semiconductor device may include, but is not limited to, the following elements. A first transistor is formed in a memory cell region. Second and third transistors are formed in a peripheral circuit region. A first insulating film is formed over the first, second and third transistors. A first conductive layer contacts the first insulating film. The first conductive layer is electrically connected with the second transistor. A second insulating film is formed over the first conductive layer. A capacitance pad is on and in contact with the second insulating film. The capacitance pad is electrically connected to the first transistor. A second conductive layer is on and in contact with the second insulating film. The second conductive layer is electrically connected with the third transistor.

In still another embodiment, a semiconductor device may include, but is not limited to, the following elements. A first transistor includes first and second diffusion regions in a memory cell region. Second and third transistors formed in a peripheral circuit region. The second transistor includes a third diffusion region. The third transistor includes a fourth diffusion region. A first contact plug is formed over the first diffusion region. A second contact plug is formed over the first contact plug. A bit line is connected to the first diffusion region of the first transistor via the first and second contact plugs. A third contact plug is formed over the third diffusion region. A first conductive layer is connected to the third diffusion region via the third contact plug. A fourth contact plug is formed over the second diffusion region. A fifth contact plug is formed over the fourth contact plug. A capacitor pad is connected to a second diffusion region of the first transistor via the fourth and fifth contact plugs. A sixth contact plug is formed over the fourth diffusion region. A seventh contact plug is formed over the sixth contact plug. A second conductive layer is connected to a fourth diffusion region via the sixth and seventh contact plugs. An eighth contact plug is formed over the second conductive layer. A third conductive layer is connected to the second conductive layer via the eighth contact plug.

In still another embodiment, a method for forming a semiconductor device may include, but is not limited to the following processes. An element isolation portion is formed in a semiconductor substrate. First and second impurity regions are formed in the semiconductor substrate. The element isolation portion separates the first and second impurity regions. A first conductive layer connected to the first impurity region is formed to partially overlap the element isolation portion. A first insulating film is formed over the first conductive layer. A second conductive layer is formed over the first insulating film and the second impurity region to partially overlap the element isolation portion. The second conductive layer is connected to the second impurity region.

In still another embodiment, a method for forming a semiconductor device may include, but is not limited to the following processes. First and second impurity regions are formed in a semiconductor substrate in a memory cell region while third and fourth impurity regions are formed in the semiconductor substrate in a peripheral circuit region. First and second contact plugs are formed over the first and second impurity regions, respectively while third and fourth contact plugs are formed over the third and fourth impurity regions, respectively. A first conductive layer is formed over the third contact plug while a bit wiring connecting the first contact plug is formed. The first conductive layer is connected to the third contact plug. An insulating film is formed over the bit wiring and the first conductive layer. A capacitance pad connecting the second contact plug is formed while a second conductive layer is formed over the insulating film, the second conductive layer being electrically connected to the fourth contact plug.

BRIEF DESCRIPTION OF THE DRAWINGS

The above features and advantages of the present invention will be more apparent from the following description of certain preferred embodiments taken in conjunction with the accompanying drawings, in which:

FIG. 1A is a fragmentary cross sectional elevation view, taken along a D-D' line of FIG. 10, illustrating a memory cell in accordance with one embodiment of the present invention;

FIG. 1B is a fragmentary cross sectional elevation view, taken along a B-B' line of FIG. 11, illustrating a memory cell in accordance with one embodiment of the present invention;

FIG. 9A is a fragmentary cross sectional elevation view, taken along a D-D' line of FIG. 10, illustrating a memory in a step involved in a method of forming the semiconductor device of FIGS. 1A and 1B;

FIG. 9B is a fragmentary cross sectional elevation view, taken along a B-B' line of FIG. 11, illustrating a memory in a step involved in a method of forming the semiconductor device of FIGS. 1A and 1B;

DETAILED DESCRIPTION OF THE PREFERRED EMBODIMENTS

Figure 1C:
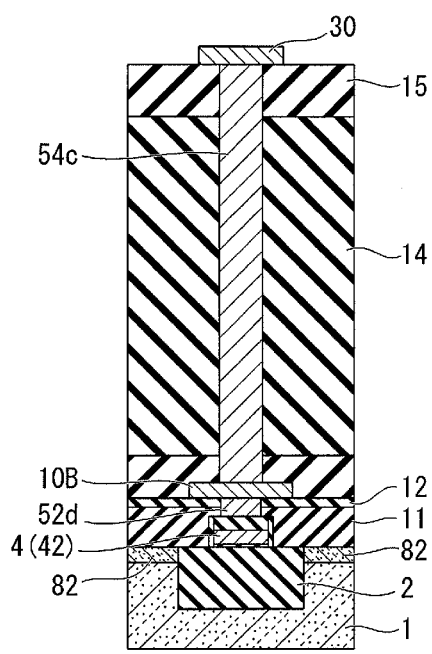
FIG. 1C is a fragmentary cross sectional elevation view illustrating a peripheral circuit region in accordance with one embodiment of the present invention.
Figure 1D:
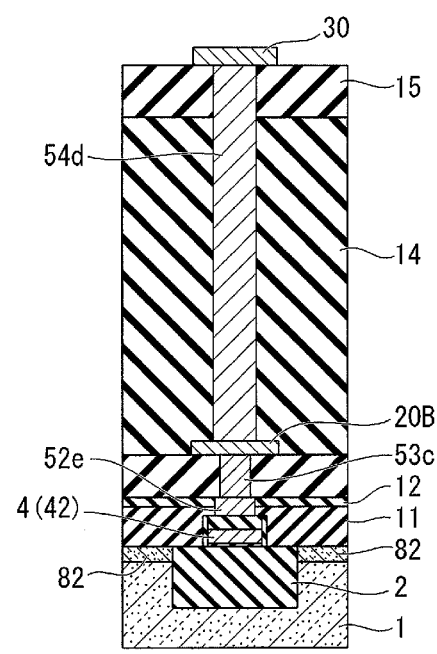
FIG. 1D is a fragmentary cross sectional elevation view illustrating a peripheral circuit region in accordance with one embodiment of the present invention.

Before describing the present invention, the related art will be explained in detail, with reference to drawings, in order to facilitate the understanding of the present invention.

When the electrode of the capacitor is formed in a 3-dimensional structure, it becomes necessary to prepare an interlayer insulating layer with a very great thickness corresponding to the height of the capacitor. Also, in a peripheral circuit region, it is necessary to prepare a contact plug having a great enough height as to penetrate the thick interlayer insulating layer to connect a MOS transistor disposed on the surface of a semiconductor substrate with a metal interconnection layer disposed thereon.

Furthermore, when the metal interconnection layer is connected to the MOS transistor prepared on the surface of the semiconductor substrate using only one contact plug, it may be difficult to perform a processing operation because the contact plug has an excessively large aspect ratio. For this reason, an intermediate interconnection layer or pad may be prepared between the metal interconnection layer and the MOS transistor. It may be necessary to connect the metal interconnection layer and the MOS transistor by interposing a plurality of contact plugs in series therebetween.

The following method has been proposed. A bit line pad used as a memory cell or a lower electrode, which also refer to as an accumulation electrode, of a capacitor is employed as an intermediate interconnection layer of a peripheral circuit region (for example, refer to JP-A-11-214660, JP-A-2002-319632, and JP-A-2005-260254) because an obstacle is caused in an interconnection layout when a metal interconnection layer is only provided in an upper layer.

However, when a lower electrode of a capacitor is processed in a cylindrical shape, it is necessary to form the lower electrode using an inner wall of a previously prepared contact hole. Accordingly, it becomes troublesome to simultaneously process the lower electrode of the capacitor and an interconnection layer of a peripheral circuit region as in JP-A-2002-319632 and JP-A-2005-2602543.

Here, it is easy to simultaneously process bit lines used in a memory cell region and intermediate interconnection layers used in the peripheral circuit region. However, for example, for forming a sense amplifier circuit, a plurality of MOS transistors is disposed to connect interactive source and drain regions (or diffusion layers) and gate electrodes. Accordingly, the intermediate interconnection layers should be disposed at a higher density than in the memory cell region. Also, when the bit lines are used as the intermediate interconnection layers in the peripheral circuit region, interconnection layers cannot be disposed adjacent to one another at a line-width and interval below the design rule determined by the resolution of a photolithography technique used for the processing of the bit lines. Accordingly, when a pitch at which cells are disposed is reduced by downscaling memory cells, disposing the plurality of MOS transistors and the intermediate interconnection layers at the reduced pitch may become difficult, thus hindering the miniaturization of devices.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, the following elements. First and second diffusion regions are formed in a semiconductor substrate. An element isolation portion separates the first and second diffusion regions each other. A first insulating film is formed over the element isolation portion and the first and second diffusion regions. First and second contact plugs are formed over the first and second diffusion regions, respectively. The first and second contact plugs penetrate the first insulating film. A first conductive layer is formed over the first insulating film. A second insulating film is formed over the first conductive layer. A third contact plug penetrates the second insulating film. The third contact plug is connected to the first contact plug. A second conductive layer is formed over the second insulating film. The second conductive layer contacts the third contact plug. The first and second conductive layers partly overlap the element isolation portion.

In some cases, the semiconductor device may include, but is not limited to, the first and second contact plugs connected to the first and second diffusion regions, respectively.

In some cases, the semiconductor device may further include, but is not limited to, a fourth contact plug. The second conductive layer is connected to the second diffusion region through fourth contact plug. The fourth contact plug comprises a material same as a material included in the third contact plug.

In some cases, the semiconductor device may further include, but is not limited to, the following elements. A third insulating film is formed over the second conductive layer. A fifth contact plug penetrates the third insulating film. The fifth contact plug is connected to the second conductive layer. A third conductive layer is formed over the third insulating film. The third conductive layer contacts the fifth contact plug.

In some cases, the semiconductor device may include, but is not limited to, the first diffusion region of a first transistor and the second diffusion region of a second transistor.

In another embodiment, a semiconductor device may include, but is not limited to the following elements. A first transistor is formed in a memory cell region. Second and third transistors are formed in a peripheral circuit region. A first insulating film is formed over the first, second and third transistors. A first conductive layer contacts the first insulating film. The first conductive layer is electrically connected with the second transistor. A second insulating film is formed over the first conductive layer. A capacitance pad is on and in contact with the second insulating film. The capacitance pad is electrically connected to the first transistor. A second conductive layer is on and in contact with the second insulating film. The second conductive layer is electrically connected with the third transistor.

In some cases, the semiconductor device may include, but is not limited to, the second transistor adjacent to the third transistor.

In some cases, the semiconductor device may further include, but is not limited to, an element isolation portion between the second transistor and the third transistor. In some cases, the semiconductor device may include, but is not limited to, the first conductive layer whose width is greater than $(5/3) \times R1$. $R1$ is a width of the element isolation portion.

In some cases, the semiconductor device may include, but is not limited to, the first and second conductive films partially overlapping the element isolation portion.

In some cases, the semiconductor device may include, but is not limited to, the element isolation portion is the same in width as the first and second contact plugs.

In some cases, the semiconductor device may further include, but is not limited to, first and second contact plugs electrically connected to the first and second conductive layers, respectively. The first and second contact plugs are electrically connected to the first and second transistors, respectively.

In still another embodiment, a semiconductor device may include, but is not limited to, the following elements. A first transistor includes first and second diffusion regions in a memory cell region. Second and third transistors formed in a peripheral circuit region. The second transistor includes a third diffusion region. The third transistor includes a fourth diffusion region. A first contact plug is formed over the first diffusion region. A second contact plug is formed over the first contact plug. A bit line is connected to the first diffusion region of the first transistor via the first and second contact plugs. A third contact plug is formed over the third diffusion region. A first conductive layer is connected to the third diffusion region via the third contact plug. A fourth contact plug is formed over the second diffusion region. A fifth contact plug is formed over the fourth contact plug. A capacitor pad is connected to a second diffusion region of the first transistor via the fourth and fifth contact plugs. A sixth contact plug is formed over the fourth diffusion region. A seventh contact plug is formed over the sixth contact plug. A second conductive layer is connected to a fourth diffusion region via the sixth and seventh contact plugs. An eighth contact plug is formed over the second conductive layer. A third conductive layer is connected to the second conductive layer via the eighth contact plug.

In some cases, the semiconductor device may further include, but is not limited to, an element isolation portion contacting the third and fourth diffusion regions.

In some cases, the semiconductor device may further include, but is not limited to, a first insulating film over the element isolation portion. The element isolation portion is substantially aligned to the first insulating film.

In some cases, the semiconductor device may include, but is not limited to, the first and second conductive layers partly overlapping the element isolation portion.

In some cases, the semiconductor device may include, but is not limited to, a distance between the third and fourth diffusion regions is substantially the same as a width of the element isolation portion.

In some cases, the semiconductor device may further include, but is not limited to, the following elements. A first gate electrode is of the second transistor. A second gate electrode is of the third transistor. A ninth contact plug is electrically connected with the first gate electrode. A fourth conductive layer is formed over the ninth contact plug. The fourth conductive layer is connected to the first gate electrode via the ninth contact plug. A tenth contact plug is electrically connected with the second gate electrode. An eleventh contact plug is formed over the tenth contact plug. A fifth conductive layer is formed over the eleventh contact plug. The fifth conductive layer is electrically connected to the second gate electrode via the tenth and eleventh contact plugs.

In some cases, the semiconductor device may include, but is not limited to, the first conductive layer and the bit line are formed in the same level.

In some cases, the semiconductor device may include, but is not limited to, the second conductive layer and the capacitor pad are formed in the same level.

In still another embodiment, a method for forming a semiconductor device may include, but is not limited to the following processes. An element isolation portion is formed in a semiconductor substrate. First and second impurity regions are formed in the semiconductor substrate. The element isolation portion separates the first and second impurity regions. A first conductive layer connected to the first impurity region is formed to partially overlap the element isolation portion. A first insulating film is formed over the first conductive layer. A second conductive layer is formed over the first insulating film and the second impurity region to partially overlap the element isolation portion. The second conductive layer is connected to the second impurity region.

In some cases, the method for forming the semiconductor device may further include, but is not limited to, forming first and second contact plugs connected to the first and second impurity regions, respectively before forming the first conductive layer.

In some cases, the method for forming the semiconductor device may further include, but is not limited to, forming a third contact plug connected to the second contact plug before forming the second conductive layer.

In some cases, forming the first conductive layer further include, but is not limited to, etching a surface of the second contact plug.

In still another embodiment, a method for forming a semiconductor device may include, but is not limited to the following processes. First and second impurity regions are formed in a semiconductor substrate in a memory cell region while third and fourth impurity regions are formed in the semiconductor substrate in a peripheral circuit region. First and second contact plugs are formed over the first and second impurity regions, respectively while third and fourth contact plugs are formed over the third and fourth impurity regions, respectively. A first conductive layer is formed over the third contact plug while a bit wiring connecting the first contact plug is formed. The first conductive layer is connected to the third contact plug. An insulating film is formed over the bit wiring and the first conductive layer. A capacitance pad connecting the second contact plug is formed while a second conductive layer is formed over the insulating film, the second conductive layer being electrically connected to the fourth contact plug.

In some cases, the method for forming the semiconductor device may further include, but is not limited to, forming an element isolation portion between the third and fourth impurity regions.

In some cases, forming the first conductive layer may further include, but is not limited to, etching a surface of the fourth contact plug.

Hereinafter, in one embodiment, a DRAM (Dynamic Random Access Memory) as the semiconductor device will be described. In the drawings used for the following description, to facilitate understanding of the embodiments, illustrations are partially enlarged and shown, and the sizes and ratios of constituent elements are not limited to being the same as the actual dimensions. Materials, sizes, and the like exemplified in the following description are just examples, and the invention is not limited thereto and may be appropriately modified within the scope which does not deviate from the embodiments.

First Embodiment

Figure 11:
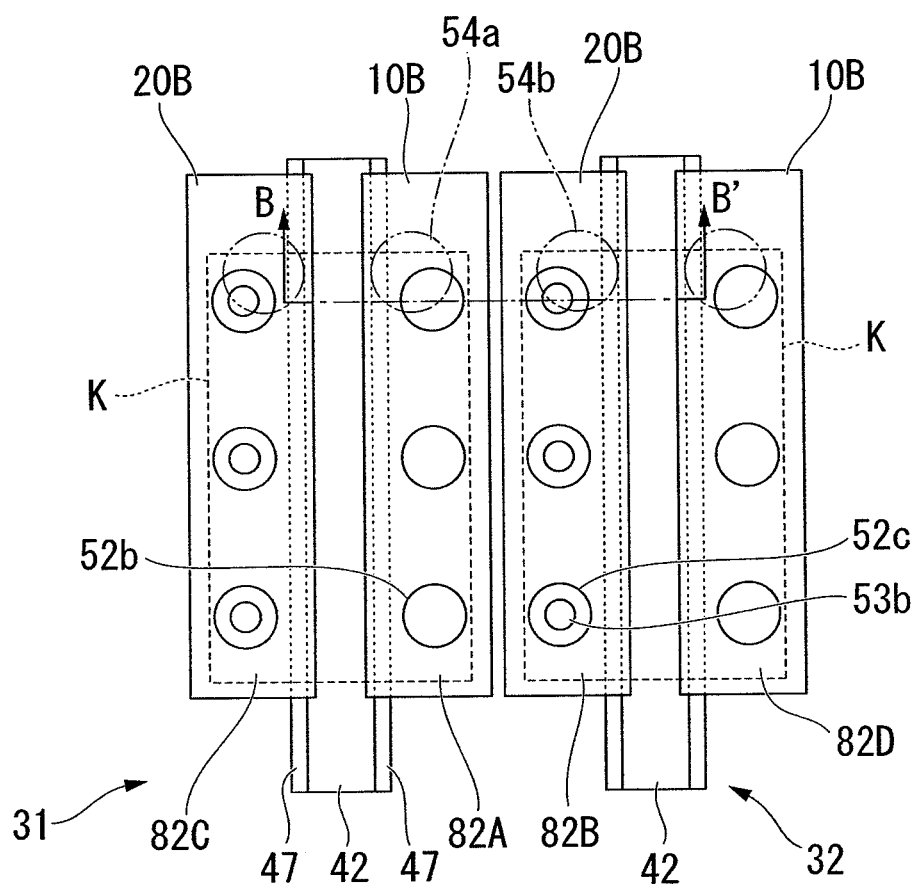
FIG. 11 a fragmentary plan view integrally illustrating a memory cell including a semiconductor device in accordance with one embodiment of the present invention.
Figure 12:
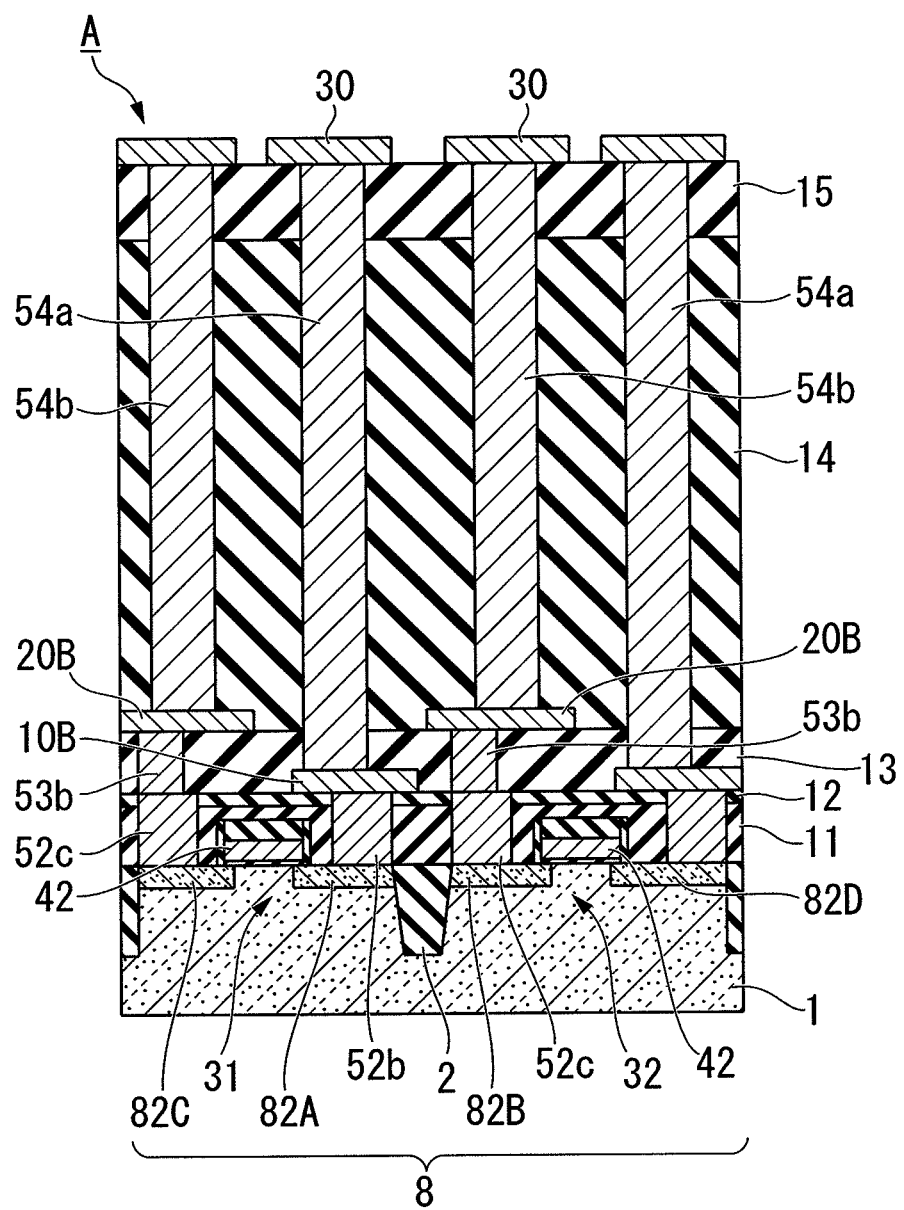
FIG. 12 is a fragmentary cross sectional elevation view, taken along a B-B' line of FIG. 11, illustrating a memory in a step involved in a method of forming the semiconductor device of FIGS. 1A and 1B.

FIGS. 1A, 1B, and 12 are schematic cross-sectional views of a semiconductor device A as a DRAM device including a plurality of MOS transistors according to the first embodiment of the present invention. FIGS. 2A through 9A and 2B through 9B are schematic cross-sectional views illustrating respective processes of a method of fabricating a semiconductor device according to the present embodiment. FIGS. 1A through 9A are each cross-sectional views taken along section indication lines D-D' of each schematic plan view of FIGS. 10 and 11, and FIGS. 1B through 9B and 12 are each cross-sectional views taken along section indication lines B-B' of each of the schematic plan views of FIGS. 10 and 11.

<Structure of Semiconductor Device>

To begin with, the construction of the semiconductor device A according to the present embodiment will be chiefly described hereinafter with reference to FIGS. 1A, 1B, 1C, 1D and 10.

The semiconductor device A according to the present embodiment includes a memory cell region 7 and a peripheral circuit region 8 provided over a semiconductor substrate 1. In the memory cell region 7, a portion of the semiconductor substrate 1 is doped with an impurity, thereby forming a memory cell diffusion layer (a first diffusion layer) 72. In the peripheral circuit region 8, a portion of the semiconductor substrate 1 is doped with an impurity, thereby forming a peripheral circuit diffusion layer (a second diffusion layer) 82. A first level interconnection 10 is provided in the memory cell region 7 as a bit line 10A connected to the memory cell diffusion layer 72. Also the first level interconnection 10 is provided in the peripheral circuit region 8 as a first intermediate interconnection layer 10B connected to any one of the peripheral circuit diffusion layer 82 and a gate electrode 4 (42). Furthermore, a second level interconnection 20 is provided in the memory cell region 7 as a capacitance pad 20A for a capacitor connected to the memory cell diffusion layer 72. Also, the second level interconnection 20 is provided in the peripheral circuit region 8 as a second intermediate interconnection layer 20B connected to any one of the peripheral circuit diffusion layer 82 and a gate electrode 4 (42) via a stack structure of at least two contact plugs (refer to a second contact plug 52c and a third contact plug 53b of FIG. 1B and a second contact plug 52e and a third contact plug 53c of FIG. 1D).

More specifically, an element isolation portion 2 is formed in the semiconductor device A according to the present embodiment so that the element isolation portion 2 isolates active regions K from each other in the semiconductor substrate 1. A first metal-oxide-semiconductor (MOS) transistor 3 is provided in the memory cell region 7. Second and third MOS transistors 31 and 32 are provided in the peripheral circuit region 8.

Also, in the memory cell region 7 of the semiconductor device A, a gate electrode (a first gate electrode) 41 is provided over the active region K of the semiconductor substrate 1 and forms a portion of a word line W. First contact plugs 51a, 51b, and 51c are formed over the memory cell diffusion layer that performs one of first source and drain regions 72. Also, second contact plugs 52b and 52c are formed over the peripheral circuit diffusion layers 82A and 82B in the peripheral circuit region 8. Further, second contact plugs 52d and 52e are formed over the gate electrode 42 in the peripheral circuit region 8. A second contact plug 52a is formed in the memory cell region 7. The second contact plug 52a is connected to the first contact plug 51a. Furthermore, the semiconductor device A includes third contact plugs 53a, which are connected to the first contact plugs 51b and 51c, respectively, in the memory cell region 7. The semiconductor device A includes a third contact plug 53b connected to the second contact plug 52c in the peripheral circuit region 8. The semiconductor device A further includes a third contact plug 53c connected to the second contact plug 52e in the peripheral circuit region 8.

Also, the semiconductor device A includes the first level interconnection 10 including the bit line 10A in the memory cell region 7 and the first intermediate interconnection layer 10B in the peripheral circuit region 8. The bit line 10A is separated from the first intermediate interconnection layer 10B. The bit line 10A is connected to the memory cell diffusion layer 72 via a stack structure of the first and second contact plugs 51a and 52a. The first intermediate interconnection layer 10B is connected via the second contact plug 52b to the peripheral circuit diffusion layers (second and third source and drain regions) 82. Also, the first intermediate interconnection layer 10B is connected via the second contact plug 52d to the gate electrode (second and third gate electrodes) 42. Further, the semiconductor device A includes the second level interconnection 20 including the capacitor pad 20A in the memory cell region 7 and the second intermediate interconnection layer 20B in the peripheral circuit region 8. The capacitor pad 20A is separated from the second intermediate interconnection layer 20B. The capacitance pad 20A for the capacitor is connected to the memory cell diffusion layer 72 via a stack structure of the first contact plugs 51b and 51c and the third contact plug 53a. The second intermediate interconnection layer 20B is connected to the peripheral diffusion layer 82 via a stack structure of the second contact plug 52b and the third contact plug 53b. The second intermediate interconnection layer 20B is connected to the gate electrode 42 via a stack structure of the second contact plug 52e and the third contact plug 53c.

Figure 10:
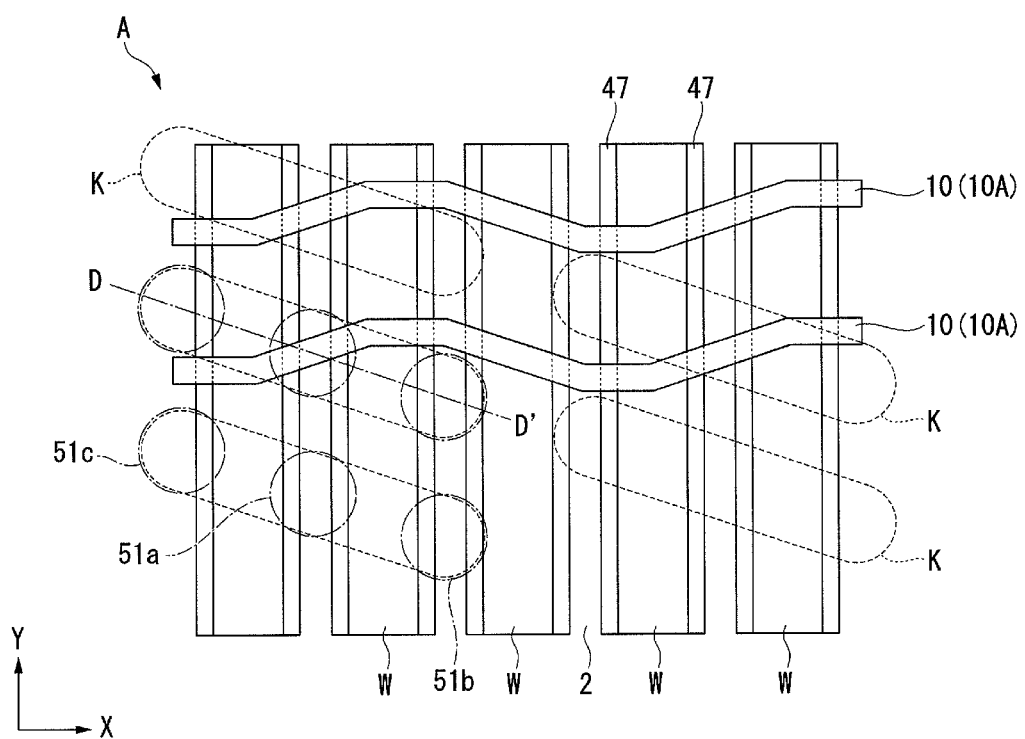
FIG. 10 a fragmentary plan view integrally illustrating a memory cell including a semiconductor device in accordance with one embodiment of the present invention.

As shown in FIGS. 1A, 1B, 1C, and 1D, the semiconductor device A according to the present embodiment, which has the DRAM device structure, may include a plurality of memory cell regions 7. A plurality of memory cells 71 are disposed in the memory cell region 7 according to predetermined rules. FIG. 10 is a fragmentary and horizontally cross-sectional view showing some elements such as word lines W and sidewall insulating layers 47 in each of the memory cells 71. In addition, a capacitor 9 is not shown in FIG. 10 but shown in FIG. 1 and FIGS. 8A, 8B, 9A, and 9B, which are fragmentary cross-sectional elevation views for illustrating processes of the semiconductor device A.

Also, each of the memory cells 71 has a MOS transistor 3 and a capacitor 9 connected to the MOS transistor 3 via a plurality of contact plugs (refer to 51b and 53a of FIG. 1A). Furthermore, the first level interconnection 10 including the bit line 10A is connected to the memory cell diffusion layers 72 corresponding to source and drain regions of the MOS transistor 3, which are not connected to the capacitor 9, via a plurality of contact plugs (refer to 51b and 52a of FIG. 1A).

As described above, a portion of the semiconductor substrate 1 is doped with an impurity, thereby forming the memory cell diffusion layer 72 in the memory cell region 7 and forming the peripheral circuit diffusion layer 82 in the peripheral circuit region 8. Also, a plurality of regions where MOS transistors 3, 31, and 32 are provided by element isolation portion 2 which isolates active regions K from each other in the semiconductor substrate 1.

For example, a P-type silicon substrate may be used as the semiconductor substrate 1. However, the present embodiment is not limited thereto and a germanium (Ge)-containing semiconductor substrate may be used as the semiconductor substrate 1.

The memory cell diffusion layer 72 is an impurity diffusion region doped with N-type impurity ions, which is provided in a predetermined position on a surface 1a of the semiconductor substrate 1 as shown in FIG. 1A.

For example, phosphorus (P) or arsenic (As) ions are implanted at a predetermined concentration into the memory cell diffusion layer 72 of the present embodiment.

Like the memory cell diffusion layer 72, the peripheral circuit diffusion layers 82 (82A, 82B, 82C, and 82D) are impurity diffusion regions doped with N-type impurity ions, which are provided in predetermined positions on the surface 1a of the semiconductor substrate 1 as shown in FIG. 1B.

Like the memory cell diffusion layer 72, for example, N-type impurity ions, such as P or As ions, may be implanted at a predetermined concentration into the peripheral circuit diffusion layer 82A of the present embodiment.

In the present embodiment, as in the planar structure of FIG. 10, in the memory cell region 7, a plurality of elongated strip-shaped active regions K are prepared in the surface of the semiconductor substrate 1 at predetermined intervals. Each elongated strip-shaped active region K extends in a direction inclined to a direction along which the word lines W extend. The active regions K are defined by the element isolation portions 2 surrounding the outer circumferences of the active regions K.

Although FIG. 10 shows a memory-cell layout known as 6F2, the layout of the active regions K according to the present embodiment is not limited thereto. For instance, another layout of active regions applied to typical memory cells (e.g., a layout known as 8F2) may be selected and applied.

Diffusion regions are formed in both end portions and a central portion of each of the active regions K. In the diffusion regions, N-type impurities are introduced. The diffusion regions may be the memory cell diffusion region 72 and the peripheral circuit diffusion layer 82 of FIGS. 1A and 1B. Each of the diffusion regions functions as a source or drain region of the first MOS transistor 3 as described above. Also, the first contact plugs 51 are disposed directly on the diffusion regions functioning as the source and drain regions of the first MOS transistor 3. The first contact plugs 51 may be first contact plugs 51a, 51b, and 51c illustrated with dotted-and-broken lines in FIG. 10.

With reference back to FIGS. 1A and 1B, the gate electrodes 4 (41 and 42) are provided on the active region K of the semiconductor substrate 1. The first gate electrode 41 is provided in the memory cell region 7 and forms a portion of the word line W. Also, the gate electrodes (second and third gate electrodes) 42 are provided in the peripheral circuit region 8 and intersect the active region K. The gate electrodes 41 and 42 may be formed of a known material used for conventional gate electrodes.

Also, a gate insulating layer 45 formed of a silicon oxide (SiO$_2$) layer is formed between each of the gate electrodes 41 and 42 shown in FIGS. 1A and 1B and the semiconductor substrate 1. A gate mask insulating layer 46 formed of a silicon nitride (Si$_3$N$_4$) layer is stacked on the surface of each of the gate electrodes 41 and 42. In addition, a sidewall insulating layer 47 formed of a silicon nitride layer is formed on a side surface of each of stack structures obtained by sequentially stacking the gate insulating layer 45, the gate electrodes 41 and 42, and the gate mask insulating layer 46.

Referring to FIG. 10, a plurality of wavy-shaped (or curved) bit lines (or first level interconnections) 10A extend in an X direction and are spaced apart from one another at predetermined intervals in a Y direction. Also, straight-line-shaped word lines W are disposed to extend in the Y direction of FIG. 10. A plurality of word lines W are disposed at predetermined intervals in the X direction of FIG. 10. Each of the plurality of word lines W extends across the active regions K as shown in FIG. 10. Each of the plurality of word lines W has crossing points that cross over the active regions K. The crossing point of the word line W performs as a gate electrode 41 of the MOS transistor 3. Although the present embodiment describes an example where the gate electrode 41 of the MOS transistor 3 is a planar gate electrode, the gate electrode 41 may be modified to a grooved gate electrode.

A plurality of second and third MOS transistors 31 and 32 are disposed in the peripheral circuit region 8 to perform predetermined circuit operations. FIG. 11 shows a plan view of the second and third MOS transistors 31 and 32 disposed adjacent to each other in the peripheral circuit region 8. The present embodiment describes a case where the second and third MOS transistors 31 and 32 are of the same conductivity type, that is, an N-type.

Furthermore, in the peripheral circuit region 8, active regions K are provided.

The gate electrode 42 is disposed in the second MOS transistor 31 to intersect the active region K defined on the semiconductor substrate 1 by the element isolation portion 2. In the present embodiment, the gate electrode 42 of the second MOS transistor 31 are independent in its extending direction from the word line W of the memory cell region 7. Also, an N-type impurity is introduced into a region of the active region K that is not covered with the gate electrode 42, thereby forming peripheral circuit diffusion layers 82A and 82C functioning as a source or drain region. Also, like the second MOS transistor 31, the gate electrode 42 extends across the active region K and peripheral circuit diffusion layers 82B and 82D are formed in the third MOS transistor 32.

The semiconductor device A according to the present embodiment includes first contact plugs 51a, 51b, 51c, 51d, and 51e second contact plugs 52b, 52c, 52d, and 52e and third contact plugs 53a, 53b, and 53c. Also, an example of the semiconductor device A of FIGS. 1A, 1B, 1C, and 1D further includes fourth contact plugs 54a, 54b, 54c, and 54d.

Each of the first contact plugs 51a, 51b, and 51c is provided on the memory cell diffusion layer 72. The second contact plug 52a, which will be described later, is stacked over the first contact plug 51. Also, the third contact plugs 53a, which will be described later, are stacked over each of the first contact plugs 51b and 51c. Furthermore, each of the first contact plugs 51b and 51c has an upper portion that has an upper side surface contacting a first interlayer insulating film 11. The remaining portion other than the upper portion of each of the first contact plugs 51b and 51c has a side surface that is covered by the sidewall insulating layer 47a.

The second contact plug 52a is provided over the first contact plug 51a in the memory cell region 7. The first level interconnection 10 (the bit line 10A) is disposed on the second contact plug 52a and connected to the second contact plug 52a. Also, the second contact plugs 52b and 52c are provided over the peripheral circuit diffusion layers 82 (82A and 82B) of the peripheral circuit region 8. The second contact plugs 52d and 52e are provided over the gate electrode 42 of the peripheral circuit region 8. The second MOS transistor 31 includes the first intermediate interconnection layer 10B which is disposed on the second contact plug 52b and connected to the second contact plug 52b. The third MOS transistor 32 includes the third contact plug 53b which is stacked over the second contact plug 52c. Also, each of the second contact plugs 52a, 52b, 52c, 52d, and 52e has an upper portion that has an upper side surface contacting the first interlayer insulating film 11. The remaining portion other than the upper portion of each of the second contact plugs 52a, 52b, 52c, 52d, and 52e has a side surface that is covered by a second interlayer insulating film 12.

The third contact plug 53a is formed over the first contact plugs 51b and 51c in the memory cell region 7. A second level interconnection 20 (a capacitance pad 20A) is disposed on the third contact plug 53a and connected to the third contact plug 53a. Also, the third MOS transistor 32 includes the third contact plug 53b which is disposed over the second contact plug 52c in the peripheral circuit region 8. The third MOS transistor 32 includes the third contact plug 53c which is disposed over the second contact plug 52e in the peripheral circuit region 8. The second intermediate interconnection layer 20B is disposed on the third contact plug 53b and connected to the third contact plug 53b. Further, the second intermediate interconnection layer 20B is disposed on the third contact plug 53c and connected to the third contact plug 53c. Furthermore, the third contact plug 53a has an upper portion that has an upper side surface contacting a third interlayer insulating film 13. The remaining portion other than the upper portion of the third contact plug 53a has a side surface that is covered by the first interlayer insulating film 11, the second interlayer insulating film 12.

The second MOS transistor 31 of the peripheral circuit region 8 includes the fourth contact plugs 54a and 54c provided on the first intermediate interconnection layer 10B. A third level interconnection 30 is disposed on the fourth contact plugs 54a and connected to the fourth contact plug 54a. A third level interconnection 30 is disposed on the fourth contact plugs 54c and connected to the fourth contact plug 54c. Also, the third MOS transistor 32 of the peripheral circuit region 8 includes the fourth contact plug 54b and 54d provided on the second intermediate interconnection layer 20B. The third level interconnection 30 is disposed on the fourth contact plug 54b and connected to the fourth contact plug 54b as the fourth contact plug 54a. The third level interconnection 30 is disposed on the fourth contact plug 54d and connected to the fourth contact plug 54d. Furthermore, a side surface of the fourth contact plugs 54a and 54c contacts the third interlayer 13, a fourth interlayer 14, and a fifth interlayer 15. A side surface of the fourth contact plug 54b and 54d contacts the fourth and fifth interlayer insulating films 14 and 15.

The first through fourth contact plugs 51, 52, 53, and 54 may be formed of materials including, but not limited to, the following materials.

To begin with, the first contact plug 51 may include, for example, polycrystalline silicon (poly-Si) containing impurities, such as P.

Also, the second contact plug 52 may be formed by sequentially stacking, for example, a titanium (Ti) layer, a titanium nitride (TiN) layer, and a tungsten (W) layer.

Furthermore, like the second contact plug 52, the third contact plug 53 may be formed by sequentially stacking a Ti layer, a TiN layer, and a W layer. In addition, the third contact plug 53 may include a metal material having a high melting point or a poly-Si layer containing impurities.

In addition, the fourth contact plug 54 may also be formed by sequentially stacking a Ti layer, a TiN layer, and a W layer.

Also, the above-described first through fifth interlayers 11 through 15 may be formed using known materials and structures with no limitations. For example, each of the first through fifth interlayers 11 through 15 may be formed of a silicon oxide layer.

As described above, the first level interconnection 10 (10A) is formed in the memory cell region 7 while the first level interconnection 10 (10B) is formed in the peripheral circuit region 8. In addition, as the first level interconnection 10, the bit wiring 10A is provided to be connected to memory cell diffusion layer 72 via a stack structure including the first and second contact plugs 51a and 52a in the memory cell region 7. In the peripheral circuit region 8, as the first level interconnection 10, the first intermediate interconnection layer 10B is provided to be connected to the peripheral circuit diffusion layer 82 via the second contact plug 52b. The first intermediate interconnection layer 10B is provided to be connected to the gate electrode 42 via the second contact plug 52d.

Although the first level interconnection 10 may be formed by sequentially stacking, for example, a tungsten nitride (tungsten nitride) layer and a W layer, the present embodiment is not limited thereto. The first level interconnection 10 may be formed of another metal layer having a high melting point or a metal silicide layer.

Like the first level interconnection 10, the second level interconnection 20 (20A) is formed in the memory cell region 7 while the second level interconnection 20 (20B) is formed in the peripheral circuit region 8. As the second level interconnection 20, the capacitor pad 20A is provided to be connected to the memory cell diffusion layer 72 via a stack structure including the first and third contact plugs 51 and 53 in the memory cell region 7. Also, as the second level interconnection 20, the second intermediate interconnection layer 20B is provided to be connected to the peripheral circuit diffusion layer 82 42 via a stack structure including the second and third contact plugs 52b and 53b in the peripheral circuit region 8. The second intermediate interconnection layer 20B is provided to be connected to the gate electrode via a stack structure including the second and third contact plugs 52e and 53c in the peripheral circuit region 8.

The second level interconnection 20 may be formed using the same material and structure as the above-described first level interconnection 10.

Here, the second MOS transistor 31 includes the peripheral circuit diffusion layer 82 connected to the first level interconnection 10 (10B), which is an upper intermediate interconnection layer (a local interconnection layer), via the second contact plug 52b. Also, in FIG. 11, the third MOS transistor 32 includes the peripheral circuit diffusion layer 82B connected to the second level interconnection 20 (a second intermediate interconnection layer 20B), which is an upper intermediate interconnection layer (a local interconnection layer), via the second and third contact plugs 52c and 53b. Furthermore, each of the intermediate interconnection layers (the first and second level interconnections 10 and 20) is connected to the third level interconnection 30 disposed thereon via the fourth contact plugs 54a and 54b (the third level interconnection is not shown in FIG. 11).

The capacitor 9 is provided over the capacitor pad 20A, which forms a portion of the second level interconnection 20. The capacitor 9 may be formed using known materials and structures used for conventional capacitors with no limitation. The material and structure of the capacitor 9 may be adopted in consideration of general characteristics of a semiconductor device.

In the example of FIGS. 1A and 1B, the capacitor 9 includes a first capacitor electrode 91 having an inside surface 91a, a capacitance insulating layer 92, and a second capacitor electrode 93. The capacitance insulating layer is provided to cover the inside surface 91a of the first capacitor electrode 91. The second capacitor electrode 93 is provided to cover the capacitance insulating layer 92 and inside surface 91a.

As in the above-described construction, the semiconductor device A according to the present embodiment includes the first level interconnection 10 including the bit line 10A and the first intermediate interconnection layer 10B which are disposed in the memory cell region 7 and the peripheral circuit region 8, respectively. As the first level interconnection 10, the bit line 10A is disposed in the memory cell region 7. As the first level interconnection 10, the first intermediate interconnection layer 10B is disposed in the peripheral circuit region 8. The first intermediate interconnection layer 10B is connected via the second contact plug 52b to the peripheral circuit diffusion layer 82 of the second MOS transistor 31. The first intermediate interconnection layer 10B is connected via the second contact plug 52d to the gate electrode 42 of the second MOS transistor 31. Furthermore, in the memory cell region 7, the first level interconnection 10 forming the bit line 10A is connected to the memory cell diffusion layer 72 of the first MOS transistor 3 via the second contact plug 52. In addition, the second level interconnection 20 includes the capacitance pad 20A and the second level interconnection layer 20B which are disposed in the memory cell region 7 and the peripheral circuit region 8, respectively. The second intermediate interconnection layer 20B is connected to the peripheral circuit diffusion layer 82 of the third MOS transistor 32 via a stack structure of the second and third contact plugs 52b and 53b. The second intermediate interconnection layer 20B is connected to the gate electrode 42 of the third MOS transistor 32 via a stack structure of the second and third contact plugs 52e and 53c.

The above-described structure allows reducing the circuit area in the peripheral circuit region 8 in the semiconductor device A, such as a DRAM device. Shrinkage of the semiconductor device A can be obtained. Horizontal dimensions of the semiconductor device A can be reduced.

<Method of Fabricating Semiconductor Device>

Hereinafter, a method of fabricating the semiconductor device A according to the present embodiment will be described with reference to FIGS. 2A through 9A and 2B through 9B (and FIGS. 1A, 1B, 10, and 11).

FIGS. 2A, 3A, 4A, 5A, 6A, 7A, 8A and 9A are cross-sectional views taken along line D-D' of the memory cell region 7 shown in the plan view of FIG. 10. FIGS. 2B, 3B, 4B, 5B, 6B, 7B, 8B, and 9B are cross-sectional views taken along line B-B' of the peripheral circuit region 8 shown in the plan view of FIG. 11. In addition, unless defined otherwise, it is assumed that the memory cell region 7 and the peripheral circuit region 8 are processed at the same time.

Initially, the method of fabricating the semiconductor device A according to the present embodiment includes the following semiconductor-substrate forming process (1). The element isolation portion 2 is formed to isolate the active regions K from each other over the semiconductor substrate 1. The gate electrode 4 formed over the corresponding active region K using a patterning process. The impurity is doped into a portion of the semiconductor substrate 1 in a self-aligned manner using the corresponding gate electrode 4 as a mask. During the semiconductor-substrate forming process (1), according to the above-described order, the memory cell diffusion layer (first source and drain regions) 72 forming the memory cell region 7 and the peripheral circuit diffusion layer (second and third source and drain regions) 82 forming the peripheral circuit region 8 are formed. Accordingly, a plurality of regions constituting the first through third metal-oxide-semiconductor (MOS) transistors 3, 31, and 32 can be prepared. Also, the memory cell diffusion layer 72 and the peripheral circuit region 8 may be separately doped with an impurity.

Next, in the present embodiment, an electrode-forming process (2) is performed as follows. A first interlayer insulating film 11 is formed by embedding an insulating layer between gate electrodes 4 (41 and 42). A first contact hole 11a is formed in the first interlayer insulating film 11 to expose a top surface of the memory cell diffusion layer 72 in the memory cell region 7. First contact plugs 51a, 51b, and 51c are formed over the memory cell diffusion layer 72 to fill the first contact hole 11a. In the electrode-forming process (2), a second interlayer insulating film 12 is formed to cover the surfaces of the first contact plugs 51a, 51b, and 51c formed in the above-described order and the first interlayer insulating film 11. Further, a second contact 12a is formed through the second interlayer insulating film 12 to expose a surface of the first contact plug 51a. Second contact holes 12b are formed in the second interlayer insulating film 12 and the first interlayer insulating film 11 to expose surfaces of the peripheral circuit diffusion layers 82A and 82B. Furthermore, in the electrode-forming process (2), second contact plugs 52b and 52c are formed over the peripheral circuit diffusion layer 82B to fill the second contact hole 12b in the peripheral circuit region 8. A second contact plug 52a is formed over the first contact plug 51a to fill the second contact hole 12a in the memory cell region 7.

Next, in the present embodiment, a first-interconnection forming process (3) is performed as follows. The first level interconnection 10 is formed as the bit line 10A connected to the second contact plug 52a in the memory cell region 7 by stacking a first level interconnection material to cover the second interlayer insulating film 12 and the second contact plugs 52a, 52b, and 52c. Then, the first level interconnection material is patterned. Also, in the first-interconnection forming process (3), the first level interconnection 10 is formed in the memory cell region 7 while the first level interconnection 10 in the peripheral circuit region 8 is formed.

Next, in the present embodiment, a second-electrode forming process (4) is performed as follows. The third interlayer insulating film 13 is formed over the first level interconnection 10. Third contact holes 13a is formed in the third interlayer 13 and the second interlayer insulating film 12 in the memory cell region 7 to expose surfaces of the first contact plugs 51b and 51c. A third contact hole 13b is formed in the third interlayer 13 in the peripheral circuit region 8 to expose a surface of the second contact plug 52b. Also, in the second-electrode forming process (4), third contact plugs 53a and 53b are formed over the first contact plugs 51b and 51c of the memory cell region 7, respectively. The second contact plugs 52c of the peripheral circuit region 8 are formed to fill the third contact holes 13a and 13b, respectively, which are formed in the above-described order.

The method of fabricating the semiconductor device A according to the present embodiment includes the following second-interconnection forming process (5). As the second level interconnection 20, the capacitor pad 20A is formed to be connected to the third contact plug 53a in the memory cell region 7 by stacking an interconnection material to cover the third interlayer 13 and then patterning the interconnection material. Also, during the second-interconnection forming process 5, the second level interconnection 20 is formed in the memory cell region 7 while the second level interconnection 20 in the peripheral circuit region 8 is formed.

The method of fabricating the semiconductor device A according to the present embodiment includes the respective processes (1) through (5) in at least the above-described order. Also, in the present embodiment, an example will now be described of a method of fabricating the semiconductor device A. The process (5) is followed by a capacitor forming process (6) and a third-interconnection forming process (7) subsequently.

Hereinafter, each of the processes (1) through (7) will be described in detail. Each of the processes (1) through (7) may optionally be included in the method of fabricating the semiconductor device A according to the present embodiment.

<Semiconductor-Substrate Forming Process 1>

The semiconductor-substrate forming process includes the following processes. The element isolation portion 2 is formed over the semiconductor substrate 1 to isolate the active regions K from each other. The gate electrode 4 (41 and 42) is formed over the corresponding active region K using a patterning process. The impurity is doped into a portion of the semiconductor substrate 1 in a self-aligned manner using the gate electrode 4 as a mask. Thus, the memory cell diffusion layer 72 forming a memory cell region 7 and the peripheral circuit diffusion layer 82 forming a peripheral circuit region 8 are formed. A plurality of regions for first through third MOS transistors 3, 31, and 32 are prepared.

Figure 2A:
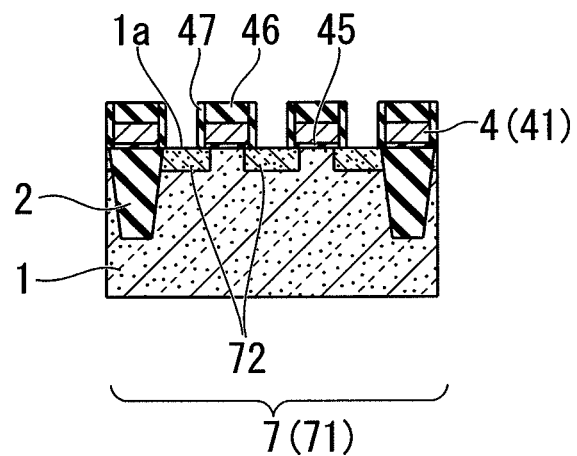
FIG. 2A is a fragmentary cross sectional elevation view, taken along a D-D' line of FIG. 10, illustrating a memory in a step involved in a method of forming the semiconductor device of FIGS. 1A and 1B.
Figure 2B:
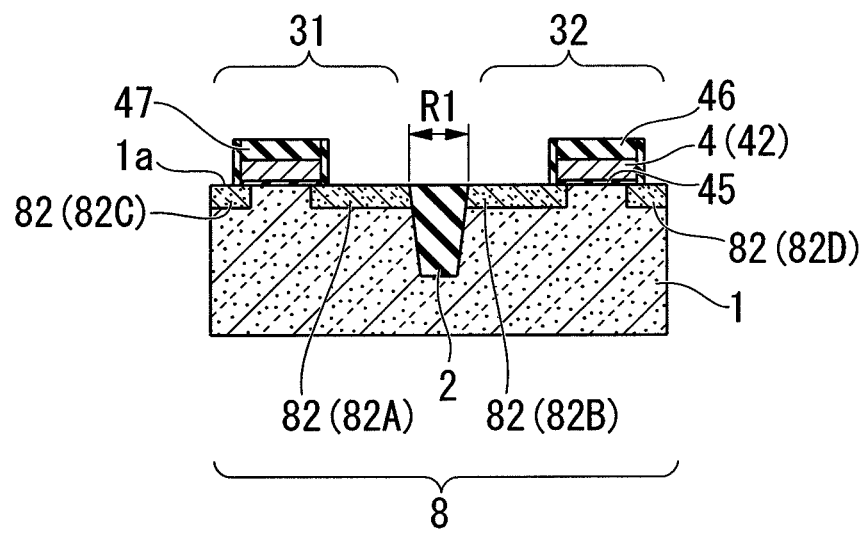
FIG. 2B is a fragmentary cross sectional elevation view, taken along a B-B' line of FIG. 11, illustrating a memory in a step involved in a method of forming the semiconductor device of FIGS. 1A and 1B.

Specifically, as shown in FIGS. 2A and 2B, first, the element isolation portion 2 is formed over the semiconductor substrate 1 to isolate the active regions K from each other using a shallow-trench-isolation (STI) technique (refer to FIG. 10). Although a P-type silicon substrate is used as the semiconductor substrate 1, the present embodiment is not limited thereto. For example, a Ge-containing semiconductor substrate may be used as the semiconductor substrate 1.

Thereafter, although not specifically shown, a gate insulating layer 45 including a silicon oxide ($SiO_2$) layer, a gate electrode 4 including a conductive layer, and a gate mask insulating layer 46 including a silicon nitride ($Si_3N_4$) layer are sequentially formed over the active regions K. Subsequently, the stack structure is patterned, thereby forming the stacked structure having the gate insulating layer 45, the gate electrode 4 (41 and 42), and the gate mask insulating layer 46 stacked in this order. In this case, for example, the gate insulating layer 45 with a thickness of about 5 nm may be formed. The gate electrode 4 with a thickness of about 150 nm may be formed. The gate mask insulating layer 46 with a thickness of about 100 nm may be formed. In addition, when a groove-type gate electrode is formed in the memory cell region 7, processes of forming the gate electrodes are separately performed in the memory cell region 7 and the peripheral circuit region 8.

Thereafter, an N-type impurity, such as P ion, is introduced into the semiconductor substrate 1 in a self-aligned manner using the gate electrode 4 as a mask. The memory cell diffusion layer 72 is formed in the memory cell region 7. The peripheral circuit diffusion layer 82 is formed in the peripheral circuit region 8. Here, each of the peripheral circuit diffusion layers 82 (82A and 82B) functions as the source or drain region (second and third source and drain regions) of the first and second MOS transistors 31 and 32 in the peripheral circuit region 8, respectively.

In this case, one of the memory cell region 7 and the peripheral circuit region 8 may be covered with a mask using a photoresist layer. An impurity may be introduced using several ion implantation processes such that the impurity concentration of the memory cell diffusion layer 72 is different from that of the peripheral circuit diffusion layer 82.

Thereafter, a sidewall insulating layer 47 including a silicon nitride layer is formed on side surfaces of the gate electrodes 41 and 42. The sidewall insulating layer 47 has a thickness of, for example, about 50 nm. Also, after forming the sidewall insulating layer 47, an N-type impurity, such as As ions, may be introduced into the active regions K, thereby forming LDD regions.

The word line W extends in the X direction of FIG. 10. The word line W has crossing points that cross over the active regions K. The crossing point of the word line W performs as the gate electrode 41 of the MOS transistor 3 in the memory cell region 7. The word line W has been formed during the foregoing semiconductor-substrate forming process, Also, the second and third MOS transistors 31 and 32 are disposed in parallel with the element isolation portion 2 interposed therebetween in the peripheral circuit region 8. In the present embodiment, in FIG. 2B, the second MOS transistor 31 has the peripheral circuit diffusion layer 82A as second source or drain region, and the third MOS transistor 32 has the peripheral circuit diffusion layer 82B as third source and drain regions. Furthermore, an element isolation width R1 may be, for example, about 60 nm in the peripheral circuit area 8.

<First-Electrode Forming Process 2>

Next, in the first-electrode forming process, an insulating layer is buried between the gate electrodes 4 (41 and 42) to form the first interlayer insulating film 11. The first contact hole 11a is formed in the first interlayer insulating film 11 in the memory cell region 7 to expose a top surface of the memory cell diffusion layer 72. Then, the first contact plugs 51a, 51b, and 51c are formed over the memory cell diffusion layer 72 to fill the first contact hole 11a. Next, the second interlayer insulating film 12 is formed to cover the surfaces of the first contact plugs 51a, 51b, and 51c and the first interlayer insulating film 11. The second contact hole 12a is formed in the second interlayer insulating film 12 to expose a top surface of the first contact plug 51a. The second contact hole 12b is formed in the second interlayer insulating film 12 and the first interlayer insulating film 11 to expose a top surface of the peripheral circuit diffusion layer 82. Also, second contact plugs 52b and 52c are formed over the peripheral circuit diffusion layer 82A and 82B in the peripheral circuit region 8 to fill the second contact hole 12b while a second contact plug 52a is formed over the first contact plug 51a in the memory cell region 7 to fill the second contact hole 12a.

Figure 3A:
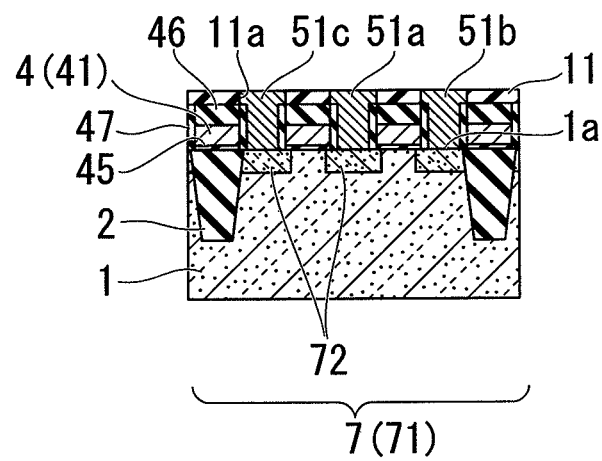
FIG. 3A is a fragmentary cross sectional elevation view, taken along a D-D' line of FIG. 10, illustrating a memory in a step involved in a method of forming the semiconductor device of FIGS. 1A and 1B.
Figure 3B:
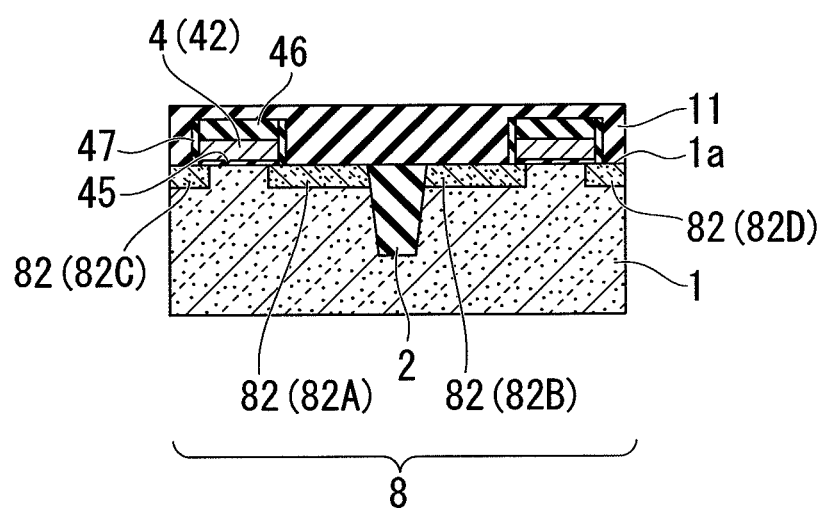
FIG. 3B is a fragmentary cross sectional elevation view, taken along a B-B' line of FIG. 11, illustrating a memory in a step involved in a method of forming the semiconductor device of FIGS. 1A and 1B.

Specifically, as shown in FIGS. 3A and 3B, an insulating layer, such as a silicon oxide layer, is initially buried between the gate electrodes 41 and 42 to form the first interlayer insulating film 11. Thereafter, the first interlayer insulating film 11 is planarized using a chemical mechanical polishing (CMP) technique. In this case, the first interlayer insulating film 11 is formed to a height (or thickness) of, for example, about 500 nm, from a surface 1a of the semiconductor substrate 1.

Next, the first contact plugs 51a, 51b, and 51c connected to the memory cell diffusion layer 72 through the first interlayer insulating film 11 are formed of, for example, poly-Si containing impurities, in the memory cell region 7. In this case, positions of the first contact plugs 51a, 51b, and 51c correspond to reference numerals 51a, 51b, and 51c indicated by broken lines of FIG. 10.

A bit line 10A (the first level interconnection 10) is connected to the first contact plug 51a disposed in the center of the active region K during the first-interconnection forming process that will be described later. Also, a capacitor 9 formed by a capacitor-device forming process is connected to the first contact plugs 51b and 51c via a third contact plug 53a and a capacitance pad 20A (a second level interconnection 20), which will be described later. The first contact plugs 51b and 51c are disposed on both sides of the active region K. In addition, the formation of the first contact plugs 51a, 51b, and 51c may be performed by a self-alignment-contact (SAC) technique using a difference in etch rate between the gate mask insulating layers 45a and 45b and the sidewall insulating layers 47a and 47b, and the first interlayer insulating film 11.

Figure 4A:
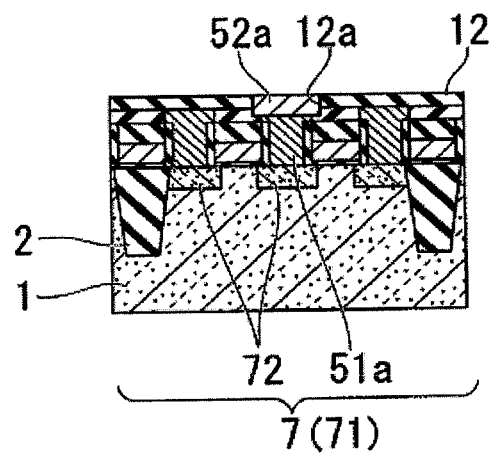
FIG. 4A is a fragmentary cross sectional elevation view, taken along a D-D' line of FIG. 10, illustrating a memory in a step involved in a method of forming the semiconductor device of FIGS. 1A and 1B.
Figure 4B:
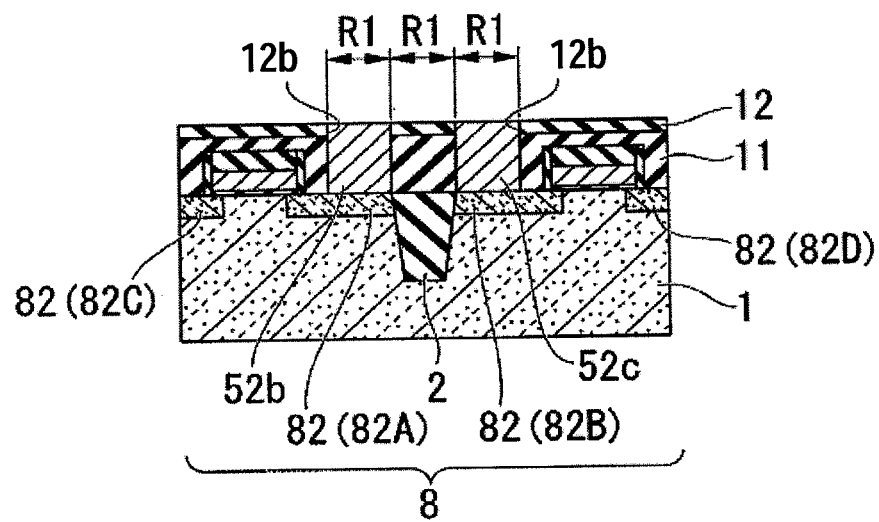
FIG. 4B is a fragmentary cross sectional elevation view, taken along a B-B' line of FIG. 11, illustrating a memory in a step involved in a method of forming the semiconductor device of FIGS. 1A and 1B.

Afterwards, as shown in FIGS. 4A and 4B, the second interlayer insulating film 12 includes a silicon oxide layer is formed to cover the surfaces of the first contact plugs 51a, 51b, and 51c and the first interlayer insulating film 11. In this case, the second interlayer insulating film 12 with a thickness of, for example, about 100 nm may be formed.

Thereafter, the second contact hole 12a is formed in the second interlayer insulating film 12 in the memory cell region 7 to expose a top surface of the first contact plug 51a. Subsequently, a second contact hole 12b is formed in the second interlayer insulating film 12 and the first interlayer insulating film 11 to expose top surfaces of the peripheral circuit diffusion layers 82A and 82B in the peripheral circuit region 8. In this case, the second contact hole 12a of the memory cell region 7 is formed to a small depth of about 100 nm so as not to reach the gate electrode 41 or the semiconductor substrate 1, while the second contact hole 12b of the peripheral circuit region 8 is formed to a great depth of about 600 nm, which is different from the depth of the second contact hole 12a of the memory cell region 7. To do this, it is preferable for the second contact holes 12a and 12b to be formed by separately performing a photolithography process and a dry etching process on the memory cell region 7 and the peripheral circuit region 8.

Next, a Ti layer, a TiN layer, and a W layer are sequentially formed to fill the second contact holes 12a and 12b and cover the second interlayer insulating film 12. Next, the W layer, the TiN layer, and the Ti layer formed over the second interlayer insulating film 12 are removed using a CMP technique, thereby forming a second contact plug 52a in the memory cell region 7 and forming second contact plugs 52b and 52c in the peripheral circuit region 8. In addition, materials of the second contact plugs 52a, 52b, and 52c are not limited thereto and may be formed of another metal material having a high melting point or a poly-Si layer containing impurities. Also, the formation of the second contact plugs 52a and 52b may be performed using an etch-back technique instead of the CMP technique. In the peripheral circuit region 8, the second contact plug connected to the peripheral circuit diffusion layer 82A is indicated by reference numeral 52b. The second contact plug connected to the peripheral circuit diffusion layer 82B is indicated by reference numeral 52c. When the first level interconnection is connected to the gate electrode 42 of the peripheral circuit region 8, the second contact plug is prepared on the gate electrode 42 as well.

The second contact plugs 52b and 52c are disposed to have a diameter and interval equal to the width R1 of the element isolation portion 2 to minimize a contact pitch. Namely, a distance between the peripheral circuit diffusion layers 82A and 82B is substantially the same as a width of the second contact plugs 52b and 52c since the element isolation portion 2 contacts with the peripheral circuit diffusion layers 82A and 82B. Further, the first interlayer insulating film 11 and the second interlayer insulating film 12 between the second contact plugs 52b and 52c are aligned to the element isolation portion 2. Thus, a pitch between adjacent second contact plugs 52b and 52c is given by 2×R1=120 nm so that the second contact plugs 52b and 52c can be densely disposed in a lateral direction of FIG. 4B. In addition, the second contact plugs 52b and 52c arranged in rows in a vertical direction in the plan view of FIG. 11 are connected to the same peripheral circuit diffusion layer. Hence, it is more preferable for the second contact plugs 52b and 52c arranged in rows in a vertical direction in the plan view of FIG. 11 to be disposed at such a pitch as to satisfy contact resistance of contact plugs in a circuit operation.

<First-Interconnection Forming Process 3>

Next, the first-interconnection forming process will be explained. First, the first level interconnection 10 is formed as a bit line 10A connected to the second contact plug 52a in the memory cell region 7. The first level interconnection material is stacked to cover the second interlayer insulating film 12 and the second contact plugs 52a and 52b and then patterning the first level interconnection material. Further, the first level interconnection 10 is formed as a first intermediate interconnection layer 10B connected to any one of the second contact plug 52b and the gate electrode 42 in the peripheral circuit region 8. The first level interconnection 10 is provided in the memory cell region 7 as the bit line 10A and in the peripheral circuit region 8 as the first intermediate interconnection layer 10B.

Figure 5A:
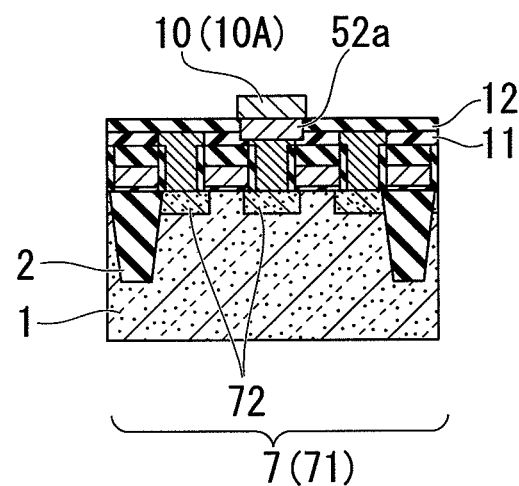
FIG. 5A is a fragmentary cross sectional elevation view, taken along a D-D' line of FIG. 10, illustrating a memory in a step involved in a method of forming the semiconductor device of FIGS. 1A and 1B.
Figure 5B:
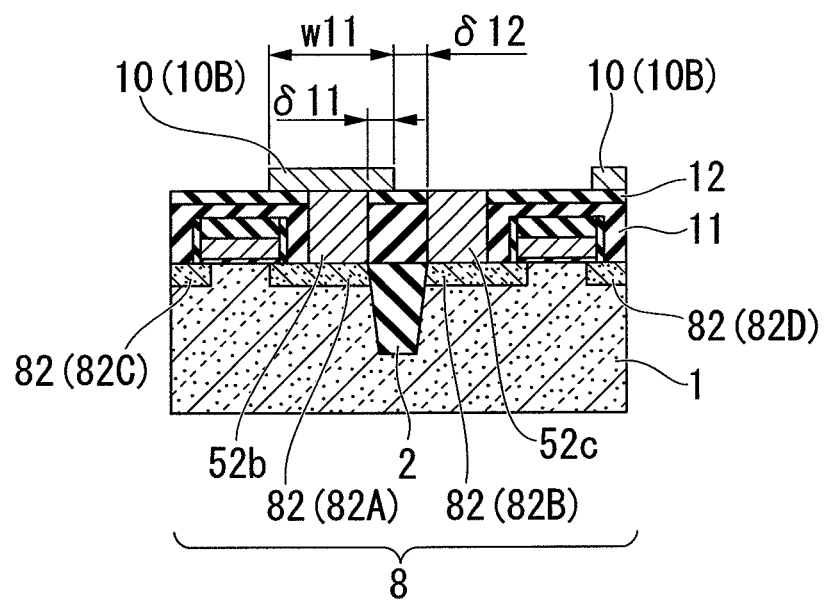
FIG. 5B is a fragmentary cross sectional elevation view, taken along a B-B' line of FIG. 11, illustrating a memory in a step involved in a method of forming the semiconductor device of FIGS. 1A and 1B.

Specifically, as shown in FIGS. 5A and 5B, first, an interconnection material is formed (refer to the first level interconnection 10). In this case, although the interconnection material may be formed by sequentially depositing a WN layer and a W layer, the interconnection material is not limited thereto. For example, the interconnection material may be another metal layer having a high melting point or a metal silicon layer. Also, the interconnection material with a thickness of, for example, about 100 nm may be formed.

Thereafter, the interconnection material is patterned using photolithography and dry etching techniques, thereby forming the first level interconnection 10. In this case, the first level interconnection 10 includes the bit line 10A connected to the surface of the second contact plug 52a in the memory cell region 7. Also, the first level interconnection 10 includes the first intermediate interconnection layer 10B connected to the surface of the second contact plug 52b in the peripheral circuit region 8. Furthermore, the patterning process is performed not to form the first level interconnection 10 (the first intermediate interconnection layer 10B) on the second contact plug 52c.

Here, the patterning of the first level interconnection 10, that is, the bit line 10A and the first intermediate interconnection layer 10B, may be simultaneously performed using one photomask in both the memory cell region 7 and the peripheral circuit region 8.

As described above, the first level interconnection 10 (the bit line 10A) formed in the memory cell region 7 functions as a bit line and has a pattern that extends in zigzag in the X direction from the plan view of FIG. 10.

Also, the first level interconnection 10 (the first intermediate interconnection layer 10B) formed in the peripheral circuit region 8 functions as an intermediate interconnection layer electrically connected to the peripheral circuit diffusion layer 82 (82A). The first intermediate interconnection layer 10B has a strip-shaped pattern that extends in a vertical direction from the plan view of FIG. 11.

Also, the interconnection material formed on the surface of the second contact plug 52c is removed by etching process to expose the surface of the second contact plug 52c. Here, when the first level interconnection 10 is formed of the same material as the second contact plug 52, the surface of the second contact plug 52c is over-etched during the patterning of the first level interconnection 10. The surface of the second contact plug 52c may be recessed. In this case, the etching process of the first level interconnection 10 is performed by adjusting an over-etched amount such that a recessed amount is generally 200 nm or less.

A width w11 of the first intermediate interconnection layer 10B ensures a one-side margin δ11 to prevent the fourth contact plug 54b formed over the first intermediate interconnection layer 10B from deviating from the first intermediate interconnection layer 10B during a subsequent third-interconnection forming process. Namely, the first intermediate interconnection layer 10B partly overlaps the element isolation portion 2 in plan view. For instance, when the fourth contact plug 54b is formed to have a diameter equal to the width R1 of the above-described element isolation portion 2, the width w11 is given by an equation {w11=R1+2×δ11}. The margin δ11 may be determined in consideration of first, second, and third maximum values. The first maximum value is a maximum value of a position adjustment deviation amount between fourth contact holes 14a and 14b (refer to FIG. 9B), which will be described later, and the first level interconnection 10. The second maximum value is a maximum value of a dimension difference of the fourth contact holes 14a and 14b. The third maximum value is a maximum value of a dimension difference of the first level interconnections 10. Also, it is experimentally preferable for the margin δ11 to have a minimum value equivalent to about ⅓ the width R1 of the element isolation portion 2. In this case, the margin δ11 is given by (5/3)×R1 or more. The margin δ11 is given about 20 nm or more when the width R1 is 60 nm.

Furthermore, although a margin δ12 is ensured between the first intermediate interconnection layer 10B and the second contact plug 52c to prevent the occurrence of an electrical short circuit, the margin δ12 is preferably set at a minimum value of 20 nm or more like the margin δ11. In the present embodiment, the second contact plugs 52b and 52c are formed at an interval equal to the width R1 (=60 nm). Thus, each of the margins δ11 and δ12 may preferably be set to a minimum value equal to the width R1. For example, the margin δ11 may be set to a minimum value of about 25 nm, and the margin δ12 may be set to a minimum value of about 35 nm. Accordingly, each of the margins δ11 and δ12 may preferably be set at a minimum value of about 20 nm or more.

As described above, even if adjacent second contact plugs 52a and 52c are disposed at an interval equal to the width R1 of the element isolation portion 2, it is acceptable for the first intermediate interconnection layer 10B to partially overlap the element isolation portion 2 in view of avoiding the first intermediate interconnection layer 10B to contact the second intermediate interconnection layer 20B which will be formed later.

<Second-Electrode Forming Process 4>

Next, in the second-electrode forming process, first, the third interlayer 13 is formed over the first level interconnection 10. The third contact holes 13a and 13b are formed in the memory cell region 7 and the peripheral circuit region 8, respectively. The third contact hole 13a is formed in the third interlayer 13 and the second interlayer insulating film 12 to expose top surfaces of the first contact plugs 51b and 51c in the memory cell region 7. The third contact hole 13b is formed in the third interlayer 13 to expose a top surface of the second contact plug 52b in the peripheral circuit region 8. Subsequently, the third contact plugs 53a and 53b are formed in the memory cell region 7 and the peripheral circuit region 8, respectively. The third contact plug 53a is formed on the first contact plugs 51b and 51c to fill the third contact hole 13a, and the third contact plug 53b is formed over the second contact plug 52b to fill the third contact hole 13b.

Figure 6A:
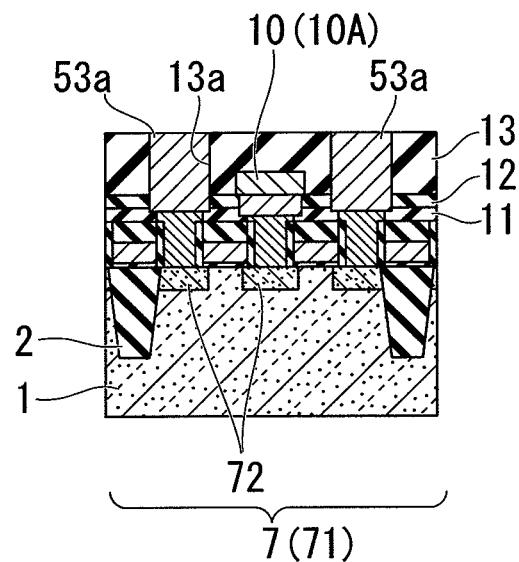
FIG. 6A is a fragmentary cross sectional elevation view, taken along a D-D' line of FIG. 10, illustrating a memory in a step involved in a method of forming the semiconductor device of FIGS. 1A and 1B.
Figure 6B:
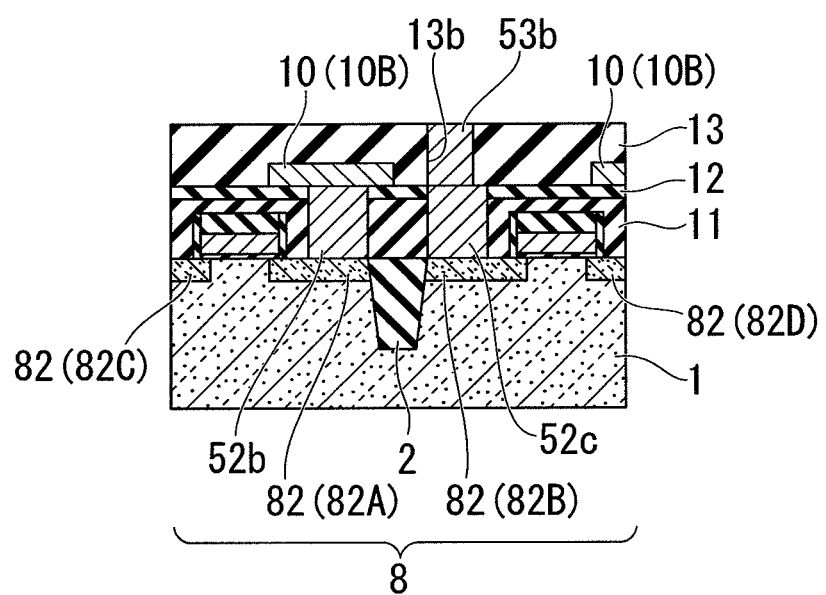
FIG. 6B is a fragmentary cross sectional elevation view, taken along a B-B' line of FIG. 11, illustrating a memory in a step involved in a method of forming the semiconductor device of FIGS. 1A and 1B.

Specifically, as shown in FIGS. 6A and 6B, a material forming the third interlayer 13, such as a silicon oxide layer, is initially deposited over the first level interconnection 10. Thereafter, the material forming the third interlayer 13 is polished using a CMP method and planarized. The third interlayer 13 with a thickness of about 400 nm is formed on the second interlayer insulating film 12.

Thereafter, third contact holes 13a are formed in the third interlayer 13 and the second interlayer insulating film 12 in the memory cell region 7 to expose the insides of the first contact plugs 52b and 51c while a third contact hole 13b is formed in the third interlayer 13 in the peripheral circuit region 8 to expose the inside of the second contact plug 52c. In this case, no contact hole is formed over the second contact plug 52b. Since there is only a small difference in depth between the third contact holes 13a and 13b formed in the memory cell region 7 and the peripheral circuit region 8 during the present process, the third contact holes 13a and 13b may be simultaneously formed in the memory cell region 7 and the peripheral circuit region 8.

Afterwards, a Ti layer, a TiN layer, and a W layer are sequentially formed to fill the third contact holes 13a and 13b and simultaneously cover the second interlayer insulating film 12. In this case, the present embodiment is not limited to the above-described materials and a metal material having a high melting point or a doped silicon layer may be employed.

The W layer, the TiN layer, and the Ti layer formed over the third interlayer 13 are removed using a CMP technique, thereby forming third contact plugs 53a and 53b in the memory cell region 7 and the peripheral circuit region 8, respectively. Also, the formation of the third contact plugs 53a and 53b may be performed using an etch-back process. Furthermore, the third contact plug 53b is stacked directly on the second contact plug 52c not to contact the adjacent first intermediate interconnection layer 10B in the peripheral circuit region 8. In addition, the third contact plug 53b may be formed to have an outer diameter equal to or less than the outer diameter of the second contact plug 52c to prevent the occurrence of an electrical short circuit between the third contact plug 53b and the first intermediate interconnection layer 10B.

In the present embodiment, when the third contact plugs 53a and 53b are formed on the first and second contact plugs, the third contact plugs 53a and 53b are directly on the first and second contact plugs without forming connection pads on the first and second contact plugs. When the third interlayer 13 has a thickness of about 400 nm, even if the third interlayer 13 is over-etched by 50% of the thickness of the third interlayer 13 during the etching process for forming the third contact holes 13a and 13b, an over-etched amount of the third interlayer 13 corresponds to about 200 nm. Accordingly, even if the third contact holes 13a and 13b are deviated from the surfaces of the underlying contact plugs due to a position difference, the third contact plugs 13a and 13b do not reach the surface 1a of the semiconductor substrate 1. Furthermore, since the top and side surfaces of the gate electrodes 41 and 42 are protected by a silicon nitride layer, an anisotropic etching process for selectively removing an interlayer insulating layer (a silicon oxide layer) may be performed. Hence, the formation of an electrical short circuit between the third contact plugs 53a and 53b and the gate electrodes 41 and 42 can be prevented.

<Second-Interconnection Forming Process 5>

Next, in the second-interconnection forming process, a second level interconnection 20 is formed as a capacitance pad 20A for a capacitor connected to the third contact plug 53a in the memory cell region 7. The second level interconnection 20 is formed as follows. An interconnection material is stacked to cover the third interlayer 13. Then, the interconnection material is patterned. Further, the second level interconnection 20 is formed as a second intermediate interconnection layer 20B connected to any one of the third contact plug 53b and the gate electrode 42 in the peripheral circuit region 8. Also, when the second level interconnection 20 is connected to the gate electrode 42 of the peripheral circuit region 8, each contact plug is disposed to be connected to the gate electrode 42 via the third contact plug 53b and the second contact plug 52b.

Figure 7A:
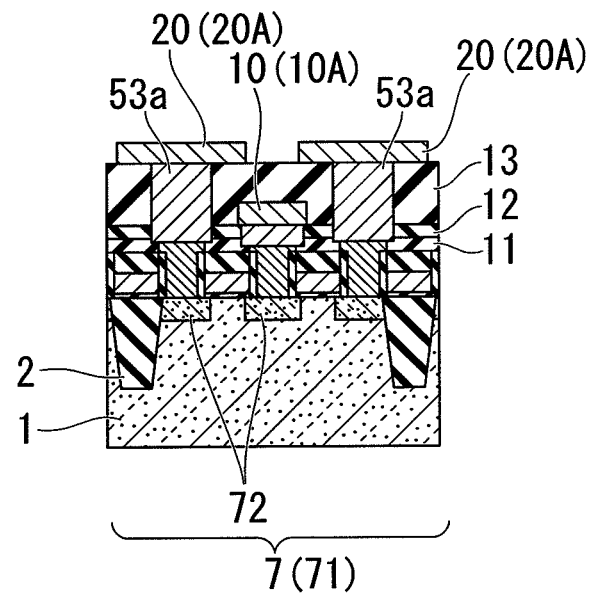
FIG. 7A is a fragmentary cross sectional elevation view, taken along a D-D' line of FIG. 10, illustrating a memory in a step involved in a method of forming the semiconductor device of FIGS. 1A and 1B.
Figure 7B:
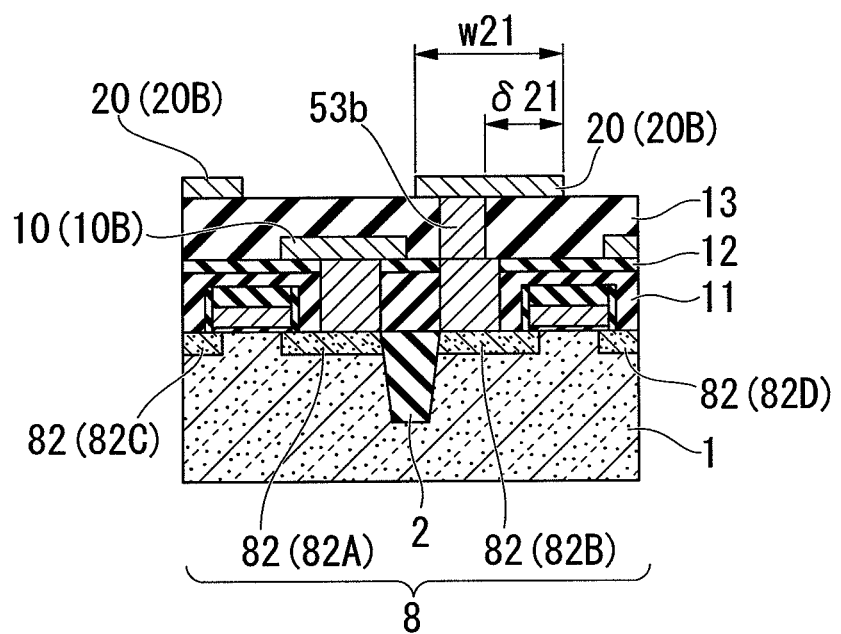
FIG. 7B is a fragmentary cross sectional elevation view, taken along a B-B' line of FIG. 11, illustrating a memory in a step involved in a method of forming the semiconductor device of FIGS. 1A and 1B.

Specifically, as shown in FIGS. 7A and 7B, an interconnection material (refer to the second level interconnection 20 in FIGS. 7A and 7B) is formed over the third interlayer 13. In this case, like the first level interconnection 10, the interconnection material is formed by sequentially depositing a TiN layer and a W layer. Also, as the first level interconnection 10, the interconnection material is not limited to the above-described materials and may be, for example, another metal layer having a high melting point or a metal silicide layer. Also, the interconnection material with a thickness of, for example, about 100 nm may be formed.

Next, the interconnection material is patterned using photolithography and dry etching techniques, thereby forming the second level interconnection 20. In this case, the capacitance pad 20A, which is a portion of the second level interconnection 20, is formed in the memory cell region 7 and contacts the surface of the third contact plug 53a. Also, the second intermediate interconnection layer 20B, which is another portion of the second level interconnection 20, is formed in the peripheral circuit region 8 and contacts the surface of the third contact plug 53b. Furthermore, the patterning of the capacitance pad 20A and the first intermediate interconnection layer 20B that form the second level interconnection 20 may be simultaneously performed using one photomask both in the memory cell region 7 and the peripheral circuit region 8.

The second level interconnection 20 (the capacitance pad 20A) formed in the memory cell region 7 functions as a capacitance pad configured to connect the third contact plug 53a with a capacitor 9 that will be described later. By preparing the capacitance pad 20A for the capacitor, the capacitor 9 having a bottom size greater than the diameter of the surface of the third contact plug 53a may be disposed. Also, it becomes easy to control positions of adjacent capacitors 9 and equalize intervals between the adjacent capacitors 9 in order to optimize the positions where the capacitors 9 are disposed.

In addition, the second level interconnection 20 (the second intermediate interconnection layer 20B) formed in the peripheral circuit region functions as an intermediate interconnection layer electrically connected to the peripheral circuit diffusion layer 82B. As can be seen from the plan view of FIG. 11, the second intermediate interconnection layer 20B in the peripheral circuit region 8 is formed as a strip-shaped pattern extending in the vertical direction. Also, a width w21 of the second intermediate interconnection layer 20B is preferably set in consideration of the margin δ21 between the second intermediate interconnection layer 20B and the third contact plug 53b. For example, the width w21 of the second intermediate interconnection layer 20B may be set to be equal to the width w11 of the first intermediate interconnection layer 10B. Here, the second intermediate interconnection layer 20B is formed to partially overlap the element isolation portion 2.

<Capacitor-Device Forming Process 6>

Next, during the capacitor-device forming process, the capacitor 9 is formed over the second level interconnection 20 (the capacitance pad 20A for the capacitor) formed over the third contact plug 53a in the memory cell region 7 using the second-interconnection forming process (5).

Figure 8A:
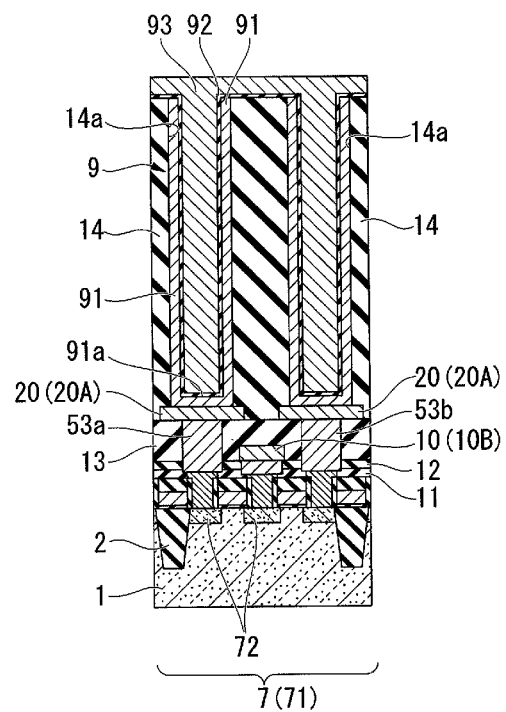
FIG. 8A is a fragmentary cross sectional elevation view, taken along a D-D' line of FIG. 10, illustrating a memory in a step involved in a method of forming the semiconductor device of FIGS. 1A and 1B.
Figure 8B:
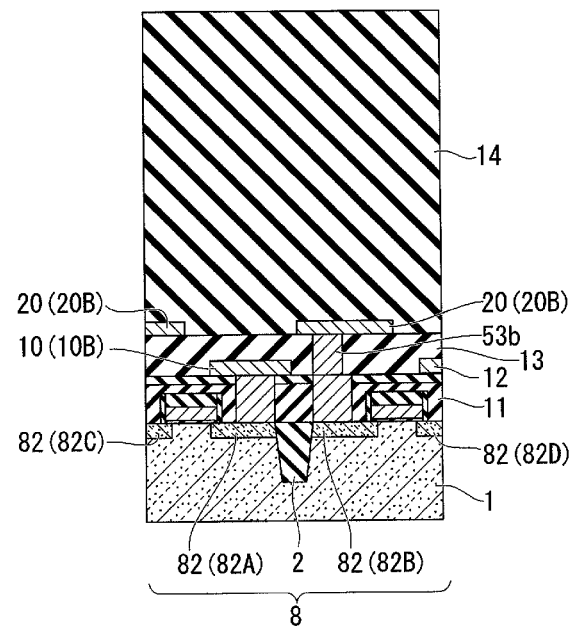
FIG. 8B is a fragmentary cross sectional elevation view, taken along a B-B' line of FIG. 11, illustrating a memory in a step involved in a method of forming the semiconductor device of FIGS. 1A and 1B.

Furthermore, in the present embodiment, a fourth interlayer 14 is stacked over the second level interconnection 20 and the third interlayer 13. A capacitor contact hole 14a is formed in the fourth interlayer 14 to expose a top surface of the capacitance pad 20A in the memory cell region 7. Afterwards, a first capacitor electrode 91 is formed to cover the capacitance pad 20A, which is exposed by the sidewalls and inside of the capacitor contact hole 14a. The first capacitor electrode 91 is cylindrical shaped. Next, the capacitance insulating layer 92 is formed to cover the inside surface 91a of the first capacitor electrode 91 and the fourth interlayer 14. A second capacitor electrode 93 is formed to cover the capacitance insulating layer 92 and fill the inside of the capacitor contact hole 14a. An example of the above-described processes will now be described. Specifically, as shown in FIGS. 8A and 8B, the fourth interlayer 14 is formed of a silicon oxide layer over the third interlayer 13 and the second level interconnection 20 (the capacitance pad 20A for the capacitor and the second intermediate layer 20B). In this case, the fourth interlayer 14 is preferably formed to a great thickness to ensure a sufficient capacitance of the capacitor 9 disposed in the memory cell region 7. For example, the fourth interlayer 14 with a thickness of, for example, about 2 μm is preferably formed.

Next, a capacitor contact hole 14a is formed in the fourth interlayer 14 in the memory cell region 7 to expose the inside of the capacitance pad 20A.

A first capacitor electrode material (refer to the first capacitor electrode 91 in FIG. 8A) is formed to cover the capacitance pad 20A exposed by the side surface and inside of the capacitor contact hole 14a and the fourth interlayer 14. In this case, although the first capacitor electrode material may be formed of, for example, a TiN layer, the present embodiment is not limited thereto. The first capacitor electrode material may be another metal layer having a high melting point.

Thereafter, the first capacitor electrode material formed over the fourth interlayer 14 is removed using a CMP method, thereby forming a first capacitor electrode (a lower electrode) 91 to cover the capacitance pad 20A exposed by the side surface and inside of the capacitor contact hole 14a.

Next, the capacitance insulating layer 92 is formed to cover the surface of the inside surface 91a of the first capacitor electrode 91 and the fourth interlayer 14. The capacitance insulating layer 92 may be formed of a high-dielectric (high-k) layer, such as a zirconium oxide ($ZrO_2$) layer, a hafnium oxide ($HfO_2$) layer, and an aluminum oxide ($Al_2O_5$) layer, or a stack layer thereof.

A second capacitor electrode material (refer to a second capacitor electrode 93 of FIG. 8A) is formed to cover the surface of the capacitance insulating layer 92 and the inside surface 91a of the first capacitor electrode 91 within the capacitor contact hole 14a. In this case, the second capacitor electrode material may be, for example, a TiN layer. Alternatively, the formation of the second capacitor electrode material may include forming a TiN layer to such a thickness so as not to cover the inside surface 91a of the first capacitor electrode 91 and stacking another material, for example, poly-Si or W over the inside surface 91a of the first capacitor electrode 91.

In addition, although the present embodiment describes the cylindrical capacitor as an example of the capacitor 9, the present embodiment is not limited thereto. For example, the first capacitor electrode 91 may be modified to a crown or pillar shape.

Thereafter, the second capacitor electrode material is patterned using photolithography and etching techniques, thereby forming the second capacitor electrode (a lower electrode) 93. As a result, the capacitor 9 including the first capacitor electrode 91, the capacitance insulating layer 92, and the second capacitor electrode 93 is formed in the memory cell region 7. Also, the second capacitor electrode 93 is formed to cover the memory cell region 7 and functions as a plate electrode configured to apply a predetermined electric potential to the capacitor 9. Also, the first capacitor electrode 91 is in contact with the capacitance pad 20A, which forms a portion of the second level interconnection 20, so that the capacitor 9 can be connected to a first MOS transistor 3.

Moreover, the second capacitor electrode material and the capacitance insulating layer are removed from the peripheral circuit region 8.

<Third-Interconnection Forming Process 7>

Next, in the third-interconnection forming process, first, the fourth contact holes 14b and 14c are formed in the fourth interlayer 14 to expose a top surface of the first intermediate interconnection layer 10B or the second intermediate interconnection layer 20B in the peripheral circuit region 8. The fourth contact plugs 54a and 54b are formed over the first and second intermediate interconnection layers 10B and 20B to fill the fourth contact holes 14b and 14c. Afterwards, an interconnection material is stacked to cover the fourth interlayer 14 and the fourth contact plugs 54a and 54b and patterned. The third level interconnection 30 connected to the first intermediate interconnection layer 10B (the first level interconnection 10) or the second intermediate interconnection layer 20B (the second level interconnection 20) via the fourth contact plugs 54a and 54b can be formed.

Specifically, as shown in FIGS. 9A and 9B, first, the fifth interlayer insulating film 15 is formed of a silicon oxide layer to cover the second capacitor electrode 93. In this case, the surface of the fifth interlayer insulating film 15 is planarized using a CMP method so that the fifth interlayer insulating film 15 with a thickness of, for example, about 400 nm can be formed.

Next, in the peripheral circuit region 8, the fourth contact holes 14b and 14c are formed in the fifth interlayer insulating film 15, the fourth interlayer insulating film 14, and the third interlayer insulating film 13 to expose the first intermediate interconnection layer 10B and the second intermediate interconnection layer 20B, respectively. The first intermediate interconnection layer 10B forms a portion of the first level interconnection 10. The second intermediate interconnection layer 20B forms a portion of the second level interconnection 20. Here, an etching process for forming the fourth contact holes 14b and 14c is preferably performed in consideration of a difference in interlayer thickness and a difference in etch rate. As for the conditions of the etching process, it is preferable that about 30% of the total thickness of the interlayer insulating films 15, 14, and 13 is over-etched to definitely expose the surface of the first intermediate interconnection layer 10B. In this case, the second intermediate interconnection layer 20B is over-etched during the formation of the fourth contact hole 14c penetrating the fourth interlayer insulating film 14 since the second intermediate interconnection layer 20B is disposed at a higher level than the first intermediate interconnection layer 10B. In the present embodiment, for example, a conductive material forming the second intermediate interconnection layer 20B (the second level interconnection 20) is selected under such a condition as to selectively etch an insulating layer (a silicon oxide layer) forming the fourth interlayer 14. Thus, the fourth contact holes 14b and 14c may be formed without causing problems.

Also, since the first intermediate interconnection layer 10B ensures the margin δ11 and the second intermediate interconnection layer 20B ensures the margin δ21, even if differences in positions where the fourth contact holes 14b and 14c are formed occur, deviation of the first and second intermediate interconnection layers 10B and 20B may be prevented or reduced.

Also, as shown in FIGS. 1A and 1B, the method of fabricating the semiconductor device according to the present embodiment includes filling the fourth contact holes 14b and 14c with a conductive material, thereby forming the fourth contact plugs 54a and 54b connected to the first and second intermediate interconnection layers 10B and 20B, respectively. In this case, a Ti layer, a TiN layer, and a W layer are sequentially deposited as the conductive material and processed using a CMP technique so that the conductive material left within the fourth contact holes 14b and 14c can serve as the fourth contact plugs 54a and 54b.

Subsequently, according to the present process, as shown in FIGS. 1A and 1B, the third level interconnection 30 connected to the fourth contact plugs 54a and 54b is formed of, for example, aluminum (Al) or copper (Cu). In this case, the formation of the third level interconnection 30 may be performed using a known conventional method with no limitations. Also, the third level interconnection 30 may be formed by a conventional known method with no limitations. Furthermore, the third level interconnection 30 is not limited to the above-described materials and may be appropriately formed of a conventional contact material.

Also, a surface protection layer (not shown) is formed of, for example, a silicon oxynitride (SiON) layer on the surface of the stack structure shown in FIGS. 1A and 1B, thereby completing the fabrication of a DRAM device as the semiconductor device A.

In addition, in the present embodiment, another metal interconnection layer may be further disposed over the third level interconnection 30 if required.

Comparison Between the Present Embodiment and the Comparative Example

Figure 14A:
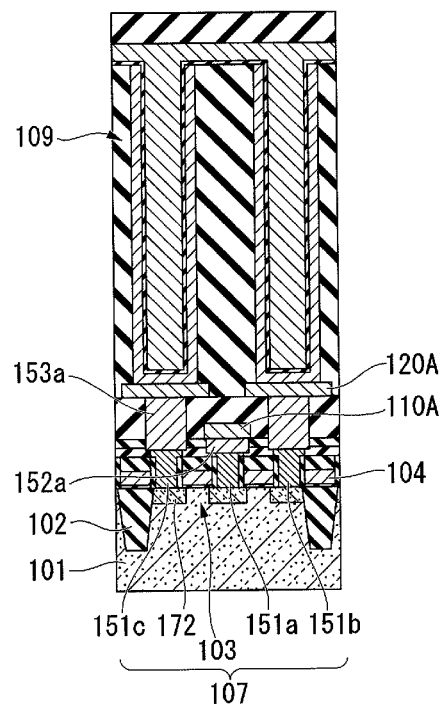
FIG. 14A is a fragmentary cross sectional elevation view illustrating a memory cell including a semiconductor device in accordance with a related art of the present invention.
Figure 14B:
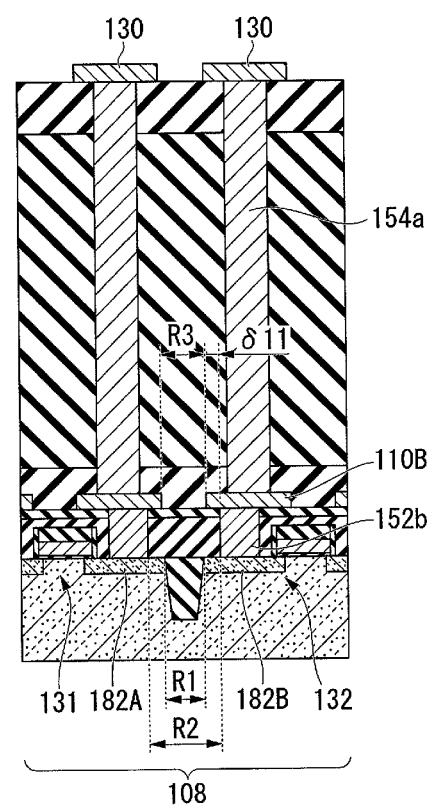
FIG. 14B is a fragmentary cross sectional elevation view illustrating a memory cell including a semiconductor device in accordance with a related art of the present invention.

FIGS. 14A and 14B are cross-sectional views of a semiconductor device 100 according to a comparative example of the semiconductor device A of the present embodiment. Hereinafter, the comparison of the semiconductor device 100 with the semiconductor device A will be described with reference to FIGS. 14A and 14B.

In the semiconductor device 100 of FIGS. 14A and 14B according to the comparative example, only a bit line (a first level interconnection) 110A of a memory cell region 107 is disposed as an intermediate interconnection layer in a peripheral circuit region 108.

The semiconductor device 100 has the memory cell region 107 in common with the semiconductor device A according to the first embodiment of the present invention. Also, in the peripheral circuit region 108, peripheral circuit diffusion layers 182A and 182B functioning as second and third source or drain regions of second and third MOS transistors 131 and 132 are connected to a third level interconnection 130 by a fourth contact plug 154a via a first level interconnection 110B.

An interval R3 between adjacent first level interconnections 110B is determined by the resolution of an applied photolithography technique. In an advanced DRAM device, when a device miniaturized to approximately the resolution limit of the photolithography technique is processed, a width R1 of an element isolation portion 102 and an interval R3 between the first level interconnections 110B is about the same minimum value equivalent to the resolution limit. Consequently, further reducing the width R1 and the interval R3 is difficult. Meanwhile, to prevent the formation of an electrical short circuit between the fourth contact plug 154a and the semiconductor substrate 101 due to a position deviation of the fourth contact plug 154a, it is necessary to prepare the margin δ11 in a second contact plug 152b. Thus, an interval R2 between the second contact plugs 152b is given by an equation $\{R2=R3+2\times\delta11\}$. Accordingly, even if the width R1 of the element isolation portion 102 is set to the minimum value and the interval R3 between the first level interconnections 110B is equalized to the width R1 of the element isolation portion 102, the second contact plugs 152b should be disposed at an interval that is increased by as much as a value of $2\times\delta11$ as compared with the semiconductor device A according to the first embodiment of the present invention. This hinders disposing MOS transistors at a high density in the semiconductor device 100 according to the comparative example, thereby precluding the fabrication of downscaled or high-density semiconductor devices.

In addition, in the semiconductor device A according to the present embodiment, as shown in the plan view of FIG. 11 (refer to FIGS. 1A and 1B), a peripheral circuit diffusion layer 82C functioning as the source or drain region is preferably formed as follows. The peripheral circuit region 8 of the second MOS transistor 31 of the peripheral circuit diffusion layer 82C may be formed to have the same structure as a peripheral circuit diffusion layer 82B of the third MOS transistor 32.

Also, in FIG. 11, the peripheral circuit diffusion layer 82D functioning as the source or drain region, which of the third MOS transistor 32 of the peripheral circuit region 8, is preferably formed to have the same structure as a peripheral circuit diffusion layer 82A of the second MOS transistor 31.

FIG. 12 is a cross-sectional view of a semiconductor device A including the peripheral circuit diffusion layers 82C and 82D.

Here, an example of the semiconductor device A shown in FIG. 11 includes two transistors. However, when at least three transistors are disposed in parallel according to the present invention, as shown in FIG. 12, it is preferable for a first intermediate interconnection layers 10B and a second intermediate interconnection layers 20B to be alternately and repetitively connected to the peripheral circuit diffusion layers 82A, 82B, 82C, and 82D. Thus, a distance between adjacent transistors may be shortened, thereby reducing the area occupied by the peripheral circuit region 8.

Also, a gate electrode 42 may be prepared to be connected to a more suitable one of the first and second intermediate interconnection layers 10B and 20B as an intermediate interconnection according to a position of a contact plug connected to the gate electrode 42. When the first intermediate interconnection layer 10B is connected to the gate electrode 42, the first intermediate interconnection layer 10B and the gate electrode 42 are connected to each other via a second contact plug 52d prepared on the gate electrode 42. Also, when the second intermediate interconnection layer 20B is connected to the gate electrode 42, the second intermediate interconnection layer 20B and the gate electrode 42 are connected to each other via a stack structure of second and third contact plugs 52e and 53c prepared on the gate electrode 42.

Furthermore, the MOS transistors 31 and 32 disposed in the peripheral circuit region 8 may have p-type conductivity. When the MOS transistors 31 and 32 have the p-type conductivity, the MOS transistors 31 and 32 may be disposed in an n-type well, and boron (B) ions may be introduced as p-type impurities into the peripheral circuit diffusion layer (a second diffusion layer).

Also, both n-type and p-type transistors may be disposed to prepare CMOS transistors.

In addition, first and second contact plugs may not be directly in contact with a semiconductor substrate but may be connected to the semiconductor substrate via a selectively epitaxially grown silicon layer.

The semiconductor device related with the present embodiment may be very effectively applied to formation of an intermediate interconnection layer of a peripheral circuit region (a connection portion) disposed adjacent to a memory cell region, such as a sense amplifier circuit or a word line driver circuit. Also, the semiconductor device related with the present embodiment may be applied to other peripheral circuit regions.

The above-described method of fabricating the semiconductor device A according to the present embodiment may involve the respective processes, thereby enabling efficient fabrication of a DRAM device having a small chip size as the semiconductor device A with a high throughput.

Second Embodiment

Hereinafter, a semiconductor device B according to a second embodiment of the present invention will be described with reference to FIG. 13.

Figure 13:
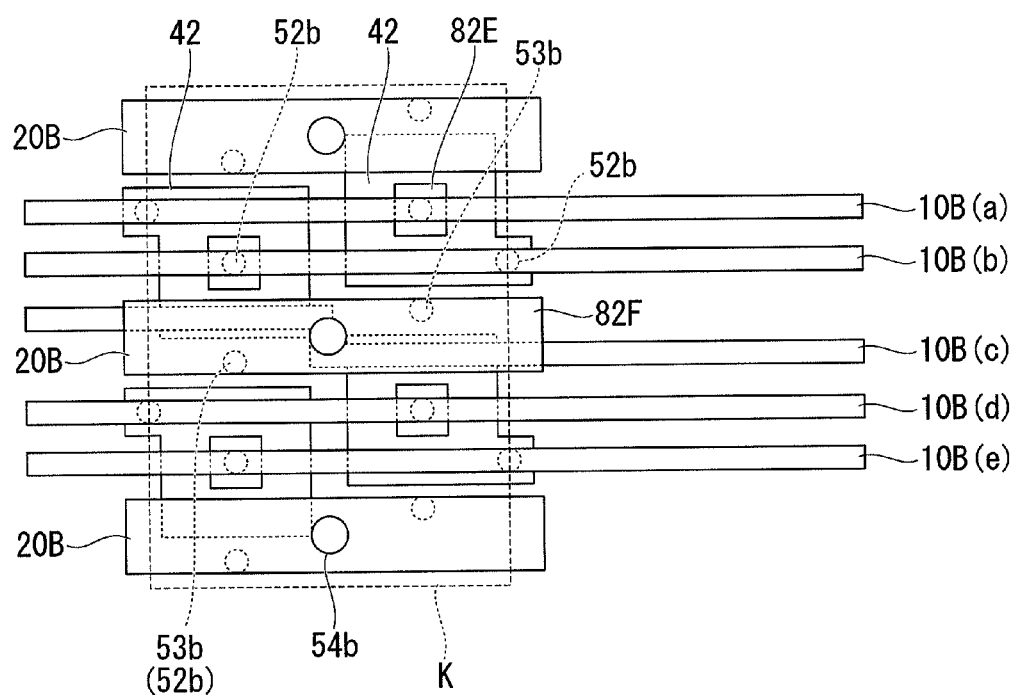
FIG. 13 a fragmentary plan view integrally illustrating a memory cell including a semiconductor device in accordance with another embodiment of the present invention.

FIG. 13 is a schematic plan view of the semiconductor device B according to the second embodiment of the present invention, which illustrates the structure of a MOS transistor disposed in a peripheral circuit region.

In the present embodiment, the same reference numerals are used to denote the same components as the semiconductor device A of the first embodiment, and a detailed description thereof will be omitted.

As shown in FIG. 13, the semiconductor device B according to the present embodiment differs from the semiconductor device A according to the first embodiment in the following constitution. The semiconductor device B is mainly disposed in the peripheral circuit region and an upper interconnection connected to any one of a first level interconnection 10B and a second level interconnection 20B is not prepared.

The semiconductor device B includes a plurality of ring-shaped gate electrodes 42 disposed in a rectangular active region K. For example, FIG. 13 illustrates four gate electrodes 42 disposed in the active region K. Referring to FIG. 13, a second contact plug 52b is connected to a central peripheral circuit diffusion layer (source or drain regions) 82E surrounded by the ring-shaped gate electrodes 42. Also, second contact plugs 52b are provided to be connected to the gate electrodes 42.

As shown in FIG. 13, five first level interconnections 10B extend in a lateral direction in the peripheral circuit region of the semiconductor device B. In FIG. 13, for brevity, reference numerals (a) through (e) are respectively assigned to the five first level interconnections 10B from above.

The first level interconnection 10B(a) connects the gate electrode 42 and the peripheral circuit diffusion layer 82E of a transistor disposed adjacent thereto and simultaneously extends in a lateral direction of FIG. 13 to be connected to another circuit (not shown). Each of the first level interconnections 10B(b), 10B(d), and 10B(e) is configured in the same manner as the first level interconnection 10B(a).

Also, the first level interconnection 10B(c) disposed in the center in a vertical direction of FIG. 13 is not connected to transistors shown in FIG. 13. However, the first level interconnection 10B(c) is disposed in the center to be connected to another transistor (not shown).

A stack plug obtained by directly stacking the second contact plug 52b and a third contact plug 53b is connected to a peripheral circuit diffusion layer (source or drain region) 82F disposed outside the ring-shaped gate electrode 42 (FIG. 13 shows only the position of the third contact plug 53b).

The second contact plugs 52b connected respectively to the peripheral circuit diffusion layers 82 E and 82 F and the gate electrode 42 may be simultaneously formed using one photomask.

Also, in the semiconductor device B, a second level interconnection 20B is provided on and connected to the third contact plug 53b. The second level interconnection 20B is electrically connected to the peripheral circuit diffusion layer 82F via the third contact plug 53b and the second contact plug 52b.

In addition, a fourth contact plug 54b is connected to the second level interconnection 20B and connected to an upper interconnection layer (not shown).

Here, since the second level interconnection 20B connected to the peripheral circuit diffusion layer 82F may be disposed on the first level interconnection 10B to intersect the first level interconnection 10B from plan view, the first level interconnection 10B and a transistor may be disposed at high density.

Figure 15:
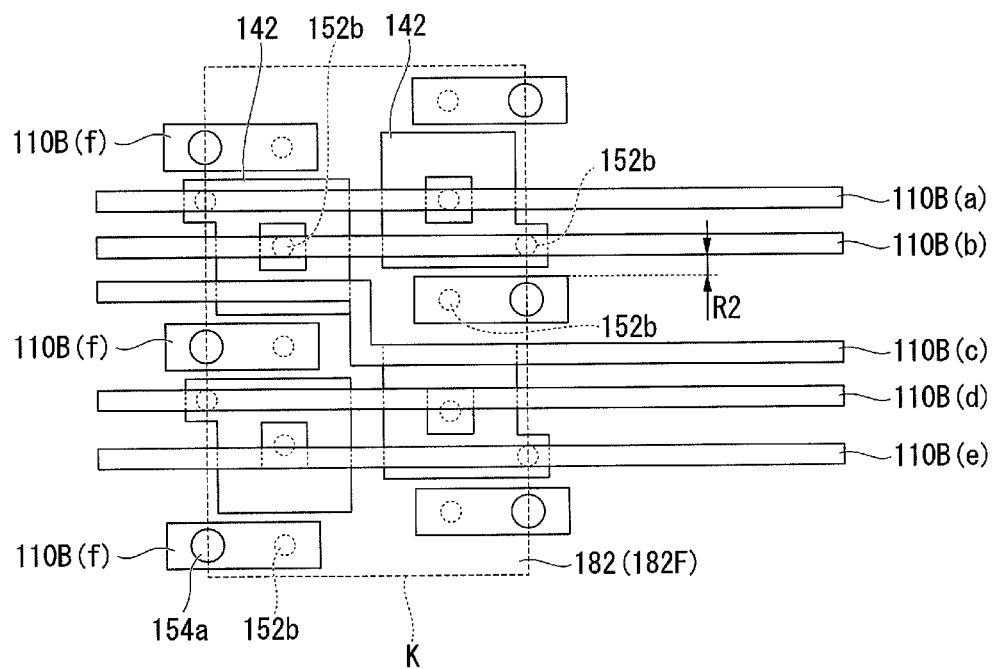
FIG. 15 is a fragmentary cross sectional elevation view illustrating a memory cell including a semiconductor device in accordance with a related art of the present invention.

FIG. 15 is a plan view of a semiconductor device 200 using only a first level interconnection 10B according to a comparative example of the semiconductor device B of the present embodiment. Hereinafter, the comparison of the semiconductor device 200 with the semiconductor device B will be described with reference to FIG. 15.

In the semiconductor device 200 of FIG. 15 according to the comparative example, a first level interconnection 110B (f) is connected to a peripheral circuit diffusion layer 182F. Here, it is necessary to determine a space R2 within the resolution limit of a photolithography process between the first level interconnection 110B(f) and a first level interconnection 110B disposed adjacent thereto. For this reason, since a first level interconnection 110B(c) is disposed away from the first level interconnection 110B(f), a dimension required to dispose the first level interconnections 110B(c) and 110B (f) is enlarged in a vertical direction of FIG. 15, thereby precluding the miniaturization of the semiconductor device 200.

As a result, in the semiconductor device B according to the embodiment of the present invention, as shown in the plan view of FIG. 13, the second contact plug 52b and the third contact plug 53b are disposed not to cause an electrical short circuit between the second and third contact plugs 52b and 53b. The first level interconnection 10B, the first level interconnection 10B and a transistor may be disposed at a higher density than the comparative example.

Accordingly, in the peripheral circuit region, when a plurality of transistors are repetitively disposed in a connection portion (a region disposed adjacent to the memory cell region) where a sense amplifier circuit or a word line driver circuit is disposed, the area occupied by the sense amplifier circuit or the word line driver circuit may be reduced effectively.

Like the semiconductor device A of the first embodiment, the semiconductor device B of the second embodiment may reduce the area occupied by a circuit disposed in the peripheral circuit region, thereby obtaining the semiconductor device B with a small chip size.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
   a semiconductor substrate; first and second diffusion regions in the semiconductor substrate;
   a first insulating film over an element isolation portion and the first and second diffusion regions;
   first and second contact plugs over the first and second diffusion regions, respectively, the first and second contact plugs penetrating the first insulating film;
   a first conductive layer over the first insulating film;
   a second insulating film over the first conductive layer;
   a third contact plug penetrating the second insulating film, the third contact plug being connected to the first contact plug;
   a fourth contact plug penetrating the second insulating film, the fourth contact plug being connected to the second contact plug;
   a capacitance pad on and in contact with the second insulating film, the capacitance pad contacting the third contact plug; and
   a second conductive layer on and in contact with the second insulating film, the second conductive layer contacting the fourth contact plug,
   wherein the capacitance pad and the second conductive layer are simultaneously formed and are at a same level,
   the second contact plug is electrically connected to the second conductive layer, the first and second contact plugs are electrically connected to the first and second diffusion regions, respectively,
   the element isolation portion is disposed adjacent to the second diffusion region, and
   the element isolation portion is the same in width as the second contact plug.

2. The semiconductor device according to claim 1, wherein the second conductive layer is connected to the second diffusion region through fourth contact plug, wherein the fourth contact plug comprises a material same as a material included in the third contact plug.

3. The semiconductor device according to claim 1, further comprising:
   a third insulating film over the second conductive layer;
   a fifth contact plug penetrating the third insulating film, the fifth contact plug being connected to the second conductive layer; and
   a third conductive layer over the third insulating film, the third conductive layer contacting the fifth contact plug.

4. The semiconductor device according to claim 1, wherein the first diffusion region is of a first transistor, and wherein the second diffusion region is of a second transistor.

5. The semiconductor device according to claim 1, wherein the third contact plug is directly connected to the first contact plug.

6. A semiconductor device comprising:
   a first transistor in a memory cell region;
   second and third transistors in a peripheral circuit region;
   a first insulating film over the first, second and third transistors;
   a first conductive layer contacting the first insulating film, the first conductive layer electrically connected with the second transistor;
   a second insulating film over the first conductive layer;
   a capacitance pad on and in contact with the second insulating film, the capacitance pad being electrically connected to the first transistor;
   a second conductive layer on and in contact with the second insulating film, the second conductive layer electrically connected with the third transistor;
   first and second contact plugs electrically connected to the first and second conductive layers, respectively, the first and second contact plugs electrically connected to the second and third transistors, respectively; and
   an element isolation portion between the second transistor and the third transistor,
   wherein the capacitance pad and the second conductive layer are simultaneously formed and are at a same level, and
   the element isolation portion is the same in width as the first and second contact plugs.

7. The semiconductor device according to claim 6, wherein the second transistor is adjacent to the third transistor.

8. The semiconductor device according to claim 6, wherein the first and second conductive layers partially overlap the element isolation portion.

9. The semiconductor device according to claim 6, wherein the second conductive layer is electrically connected to the third transistor without interposing the first conductive layer.

10. A semiconductor device comprising:
    a first transistor comprising first and second diffusion regions in a memory cell region;

second and third transistors in a peripheral circuit region, the second transistor comprising a third diffusion region, and the third transistor comprising a fourth diffusion region;

a first contact plug over the first diffusion region; a second contact plug over the first contact plug; a bit line connected to the first diffusion region of the first transistor via the first and second contact plugs;

a third contact plug over the third diffusion region;

a first conductive layer connected to the third diffusion region via the third contact plug;

a fourth contact plug over the second diffusion region;

a fifth contact plug over the fourth contact plug;

a capacitor pad connected to a second diffusion region of the first transistor via the fourth and fifth contact plugs;

a sixth contact plug over the fourth diffusion region;

a seventh contact plug over the sixth contact plug;

a second conductive layer connected to a fourth diffusion region via the sixth and seventh contact plugs;

an eighth contact plug over the second conductive layer;

a third conductive layer connected to the second conductive layer via the eighth contact plug; and an element isolation portion between the second transistor and the third transistor, wherein the capacitor pad and the second conductive layer are simultaneously formed and are at a same level, the third and sixth contact plugs electrically connect to the first and second conductive layers, respectively, the third and sixth contact plugs electrically connect to the second and third transistors, respectively, and the element isolation portion is the same in width as the third and sixth contact plugs.

11. The semiconductor device according to claim 10, wherein the element isolation portion contacts the third and fourth diffusion regions.

12. The semiconductor device according to claim 10, wherein the first and second conductive layers partly overlap the element isolation portion.

13. The semiconductor device according to claim 10, wherein a distance between the third and fourth diffusion regions is substantially the same as a width of the element isolation portion.

14. The semiconductor device according to claim 10, wherein the first conductive layer and the bit line are formed in a same level.

15. The semiconductor device according to claim 10, wherein the seventh contact plug is directly connected to the sixth contact plug.

* * * * *